US012791952B2

(12) United States Patent
Lin et al.

(10) Patent No.: US 12,791,952 B2
(45) Date of Patent: Nov. 10, 2026

(54) SYSTEMS AND METHODS FOR OPTIMIZING LITHOGRAPHIC DESIGN VARIABLES USING IMAGE-BASED FAILURE RATE MODEL

(71) Applicant: ASML NETHERLANDS B.V., Veldhoven (NL)

(72) Inventors: Chenxi Lin, Newark, CA (US); Steven George Hansen, Phoenix, AZ (US); Xin Lei, San Jose, CA (US); Yi Zou, Foster City, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 81 days.

(21) Appl. No.: 18/714,728

(22) PCT Filed: Nov. 23, 2022

(86) PCT No.: PCT/EP2022/083063
§ 371 (c)(1),
(2) Date: May 30, 2024

(87) PCT Pub. No.: WO2023/110347
PCT Pub. Date: Jun. 22, 2023

(65) Prior Publication Data
US 2025/0028255 A1 Jan. 23, 2025

Related U.S. Application Data

(60) Provisional application No. 63/290,551, filed on Dec. 16, 2021.

(51) Int. Cl.
*G03F 7/00* (2006.01)

(52) U.S. Cl.
CPC .... *G03F 7/706839* (2023.05); *G03F 7/70525* (2013.01); *G03F 7/7065* (2013.01); *G03F 7/70666* (2013.01); *G03F 7/706837* (2023.05)

(58) Field of Classification Search
CPC ............... G03F 7/70525; G03F 7/7065; G03F 7/70666; G03F 7/706837; G03F 7/706839
See application file for complete search history.

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

TW 200931200 7/2009
TW 201543172 11/2015
(Continued)

OTHER PUBLICATIONS

International Search Report and Written Opinion issued in corresponding PCT Patent Application No. PCT/EP2022/083063, dated Mar. 7, 2023.

(Continued)

*Primary Examiner* — Peter B Kim
(74) *Attorney, Agent, or Firm* — Pillsbury Winthrop Shaw Pittman LLP

(57) ABSTRACT

A method for determining values of design variables of a lithographic process based on a predicted failure rate for printing a target pattern on a substrate using a lithographic apparatus. The method includes obtaining an image corresponding to a target pattern to be printed on a substrate using a lithographic apparatus, wherein the image is generated based on a set of values of design variables of the lithographic apparatus or a lithographic process; determining image properties, the image properties representative of a pattern printed on the substrate, the pattern corresponding to the target pattern; predicting a failure rate in printing the pattern on the substrate based on the image properties; and determining a specified value of a specified design variable based on the failure rate, the specified value to be used in the (Continued)

lithographic process to print the target pattern on the substrate.

20 Claims, 12 Drawing Sheets

(56) References Cited

U.S. PATENT DOCUMENTS

| | | | |
|---|---|---|---|
| 5,523,193 | A | 6/1996 | Nelson |
| 5,969,441 | A | 10/1999 | Loopstra et al. |
| 7,587,704 | B2 | 9/2009 | Ye et al. |
| 8,200,468 | B2 | 6/2012 | Ye et al. |
| 10,545,411 | B2 | 1/2020 | Hansen |
| 11,354,484 | B2 | 6/2022 | Hansen |
| 2010/0315614 | A1 | 12/2010 | Hansen |
| 2022/0342316 | A1* | 10/2022 | Kooiman ................ G06T 7/001 |
| 2023/0100578 | A1 | 3/2023 | Cao et al. |

FOREIGN PATENT DOCUMENTS

| | | |
|---|---|---|
| TW | 202024772 | 7/2020 |
| TW | 202144904 | 12/2021 |
| WO | 2010/059954 | 5/2010 |
| WO | 2015/121127 | 8/2015 |
| WO | 2020/094389 | 5/2020 |

OTHER PUBLICATIONS

A.E. Rosenbluth et al., "Optimum Mask and Source Patterns to Print A Given Shape", Journal of Microlithography, 1(1), pp. 13-20, (2002).

Y. Granik, "Source Optimization for Image Fidelity and Throughput", Journal of Microlithography, Microfabrication, Microsystems 3(4), pp. 509-522, (2004).

R. Socha et al., "Simultaneous Source Mask Optimization (SMO)", Proceedings of SPIE, vol. 5853, pp. 180-193 (2005).

* cited by examiner

SYSTEMS AND METHODS FOR OPTIMIZING LITHOGRAPHIC DESIGN VARIABLES USING IMAGE-BASED FAILURE RATE MODEL

CROSS-REFERENCE TO RELATED APPLICATIONS

This application is the U.S. national phase entry of PCT Patent Application No. PCT/EP2022/083063 which was filed on Nov. 23, 2022, which claims priority of U.S. Provisional Application No. 63/290,551 which was filed on Dec. 16, 2021 and which is incorporated herein in its entirety by reference.

TECHNICAL FIELD

The description herein relates to lithographic apparatuses and processes, and more particularly to optimization of a lithographic process for an improved throughput.

BACKGROUND

A lithographic apparatus is a machine that applies a desired pattern onto a target portion of a substrate. The lithographic apparatus can be used, for example, in the manufacture of integrated circuits (ICs). For example, an IC chip in a smart phone, can be as small as a person's thumbnail, and may include over 2 billion transistors. Making an IC is a complex and time-consuming process, with circuit components in different layers and including hundreds of individual steps. Errors in even one step have the potential to result in problems with the final IC and can cause device failure. High process yield and high wafer throughput can be impacted by the presence of defects, especially if operator intervention is required for reviewing the defects.

BRIEF SUMMARY

In an embodiment, there is provided a method for determining values of design variables of a lithographic process based on a predicted failure rate for printing a target pattern on a substrate using a lithographic apparatus. The method includes: obtaining an image corresponding to a target pattern to be printed on a substrate using a lithographic apparatus, wherein the image is generated based on a set of values of design variables of the lithographic apparatus or a lithographic process; determining image properties, the image properties representative of a pattern printed on the substrate, the pattern corresponding to the target pattern; predicting a failure rate in printing the pattern on the substrate based on the image properties; and determining a specified value of a specified design variable based on the failure rate, the specified value to be used in the lithographic process to print the target pattern on the substrate.

Furthermore, in an embodiment, there is provided a method for determining values of design variables of a lithographic process based on a predicted failure rate for printing a target pattern on a substrate using a lithographic apparatus. The method includes: obtaining an image corresponding to a target pattern to be printed on a substrate using a lithographic apparatus, wherein the image is generated based on a set of values of design variables of the lithographic apparatus or a lithographic process; determining image properties, the image properties representative of a pattern printed on the substrate, the pattern corresponding to the target pattern; predicting a failure rate in printing the pattern on the substrate based on the image properties; and determining a specified value of a specified design variable based on the failure rate and a throughput value, the specified value to be used in the lithographic process to print the target pattern on the substrate.

Furthermore, in an embodiment, there is provided a non-transitory computer readable medium having instructions recorded thereon, which, when executed by a computer, performs the method of any of the above embodiments.

BRIEF DESCRIPTION OF THE DRAWINGS

Embodiments will now be described, by way of example only, with reference to the accompanying drawings in which.

Figure 1:
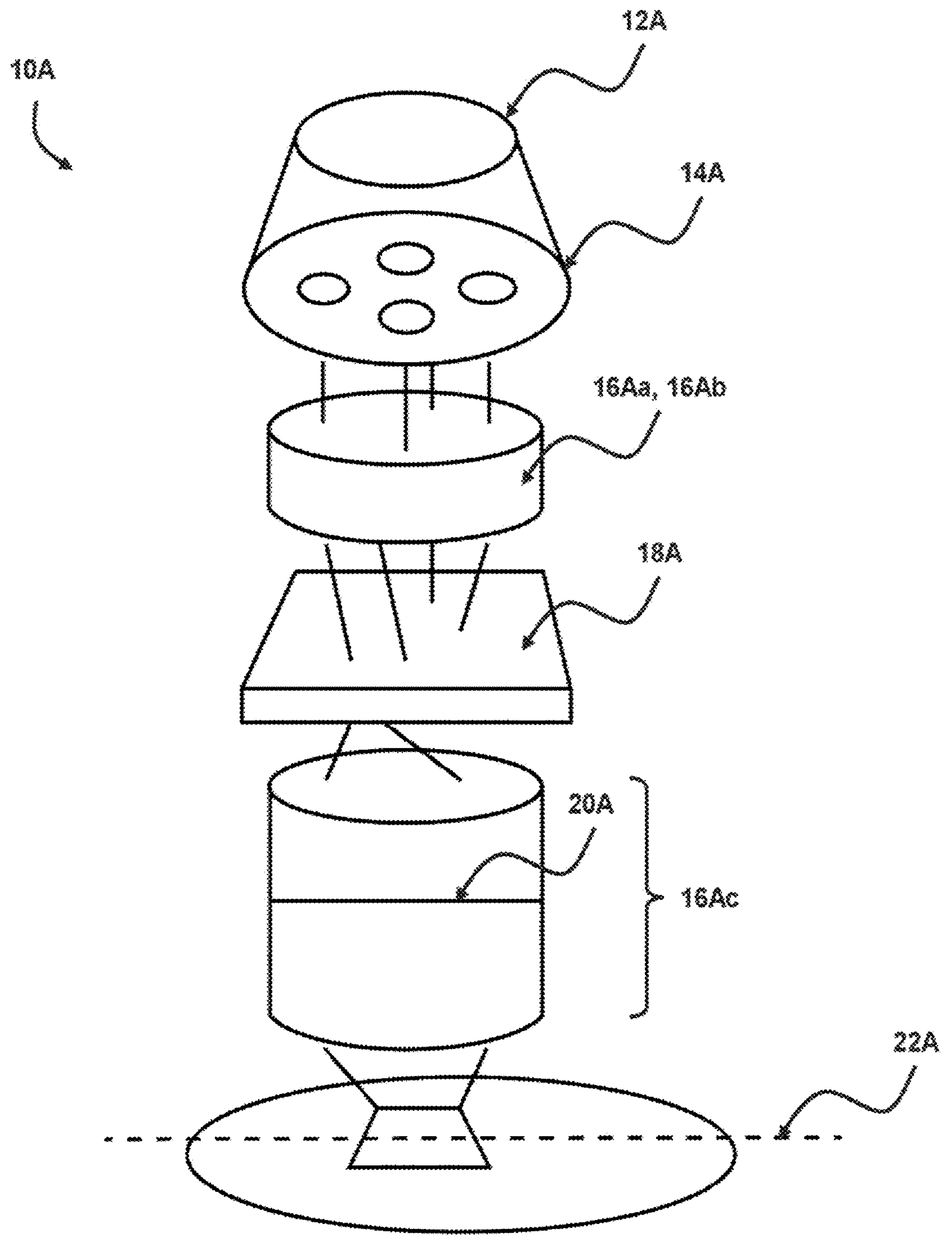
FIG. 1 is a block diagram of various subsystems of a lithography system, according to an embodiment.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

A lithographic apparatus is a machine that applies a desired pattern onto a target portion of a substrate. This process of transferring the desired pattern to the substrate is called a patterning process. The patterning process can include a patterning step to transfer a pattern from a patterning device (such as a mask) to the substrate. The mask is a master template for a given IC design. It is placed in a lithography scanner, which projects light through the mask. That, in turn, is used to pattern images on a wafer. Also, there can then be one or more related pattern processing steps, such as resist development by a development apparatus, baking of the substrate using a bake tool, etching the pattern onto the substrate using an etch apparatus, etc. Various variations (e.g., variations in the patterning process or the lithographic apparatus) can potentially limit lithography implementation for semiconductor high volume manufacturing (HVM).

Conventional techniques employ various computational methods in determining optimum values of design variables (e.g., target critical dimension (CD), pupil shape associated with an illumination source, a mask bias, dose value, focus value, a mask type, etc.) for achieving a desired output from a lithographic process. For example, some conventional methods use NILS (e.g., peak normalized image log scope value at a specified dose and focus value) as a key stochastic metric to help select the optimal pupil shape, target CD, and mask bias (which determines the throughput of the lithographic process). However, NILS as an imaging metric is not the best predictor for a stochastic defectivity (e.g., failure rate, which is defined as a number of patterns that failed to print versus total number of patterns printed on the substrate), especially when multiple patterns are considered. Some conventional methods use local CD uniformity (LCDU) for optimizing the design variables. However, LCDU is also not a direct measure of the stochastic defectivity on the wafer. Sometimes a small difference in terms of LCDU could translate into a significantly larger difference in terms of stochastic defectivity. The process optimization (e.g., optimizing design variables) in terms of LCDU and failure rate may sometimes lead to different optimal settings (e.g., LCDU based optimization may require higher dose compared to failure rate based optimization). Further, some conventional methods use a CD-based or CD distribution-based defect model (e.g., failure rate model), which may require experimental calibration of CDlim in order to connect with defectivity for every single feature. Obtaining such data for every single feature is computing resource prohibitive (e.g., since CD metrology and defect inspection may have to be performed for various focus exposure matrix (FEM) conditions, various patterns, various pupils, etc.). Some methods optimize an overlapping defect-based process window based on a target CD but do not address throughput optimization based on mask bias, or do not address optimizing a source or a mask pattern based on the failure rate.

Disclosed are embodiments for predicting a failure rate of a pattern based on an image associated with a pattern to be printed on a substrate, and determining a value of one or more design variables based on the predicted failure rate for use in a lithographic process to print the pattern on the substrate. The image may be any of an aerial image, an etch image, a resist image, a mask image, etc. associated with a target pattern to be printed on the substrate. In some embodiments, the image is an aerial image associated with the target pattern and generated based on a given set of values of design variables. The design variables may be optimized based on the predicted failure rate (e.g., for a given throughput condition). For example, the design variables may be optimized for satisfying a failure rate condition. In another example, the design variables may be optimized for satisfying a specified throughput condition (e.g., for a given failure rate condition). The failure rates may be predicted for various focus and dose values to obtain a failure rate process window. The process of predicting the failure rates may be repeated for various aerial images (e.g., generated based on different sets of values of design variables) of the target pattern, and a specified set of values that satisfies a process condition (e.g., a failure rate condition, a throughput condition etc.) may be selected from the different sets of values of design variables for use in a lithographic process for printing the target pattern on the substrate. The disclosed embodiments may also facilitate selection of values of one or more design variables as a trade-off between one or more lithographic metrics (e.g., a depth of focus, an exposure latitude, LCDU, failure rate, etc.) and throughput.

In some embodiments, a failure rate model ("FR model") of the present disclosure that is configured to predict a failure rate of a pattern based on an image associated with the pattern is advantageous over conventional methods in that the disclosed FR model may be trained or calibrated to predict the failure rates using measurement data associated with a single feature (e.g., for various design variables) as opposed to measurement data associated with every feature in the pattern like in the conventional methods (e.g., where different combinations of design variables may have to be modeled separately), thus minimizing an amount of computing resources or time (e.g., metrology time) consumed in calibrating the FR model.

Further, the disclosed embodiments may incorporate the failure rates in an optimization process such as source mask optimization (SMO) to determine design variables such as a source variable (e.g., pupil shape) of an illumination source of a lithographic apparatus, or a mask variable (e.g., a mask bias) associated with a mask pattern used to print the target pattern on the substrate. For example, the failure rate may be included in the SMO cost function (e.g., as a penalty function) along with other characteristics the cost function is computed based on. A gradient of the cost function (e.g., including the failure-rate penalty function) may be computed with respect to the source or mask variables, and the cost function be minimized based on the gradient to arrive at the optimized source or mask variables.

As a brief introduction, FIG. 1 illustrates an exemplary lithographic projection apparatus 10A.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein mean adjusting a lithographic projection apparatus such that results or processes of lithography have more desirable characteristics, such as higher accuracy of projection of design layouts on a substrate, larger process windows, etc.

Further, the lithographic projection apparatus may be of a type having two or more substrate tables (or two or more patterning device tables). In such "multiple stage" devices the additional tables may be used in parallel, or preparatory steps may be carried out on one or more tables while one or more other tables are being used for exposures. Twin stage lithographic projection apparatuses are described, for example, in U.S. Pat. No. 5,969,441, incorporated herein by reference.

The patterning device referred to above comprises or can form design layouts. The design layouts can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Major components are a radiation source 12A, which may be a deep-ultraviolet excimer laser source or other type of source including an extreme ultra violet (EUV) source (as discussed above, the lithographic projection apparatus itself need not have the radiation source), illumination optics which define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

In an optimization process of a system, a figure of merit of the system can be represented as a cost function. The optimization process boils down to a process of finding a set of parameters (design variables) of the system that minimizes the cost function. The cost function can have any suitable form depending on the goal of the optimization. For example, the cost function can be weighted root mean square (RMS) of deviations of certain characteristics (evaluation points) of the system with respect to the intended values (e.g., ideal values) of these characteristics; the cost function can also be the maximum of these deviations (i.e., worst deviation). The term "evaluation points" herein should be interpreted broadly to include any characteristics of the system. The design variables of the system can be confined to finite ranges or be interdependent due to practicalities of implementations of the system. In case of a lithographic projection apparatus, the constraints are often associated with physical properties and characteristics of the hardware such as tunable ranges, or patterning device manufacturability design rules, and the evaluation points can include physical points on a resist image on a substrate, as well as non-physical characteristics such as dose and focus.

In a lithographic projection apparatus, a source provides illumination (i.e. light); projection optics direct and shapes the illumination via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in commonly assigned U.S. Pat. No. 8,200,468, disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the source and the projection optics.

Figure 2:
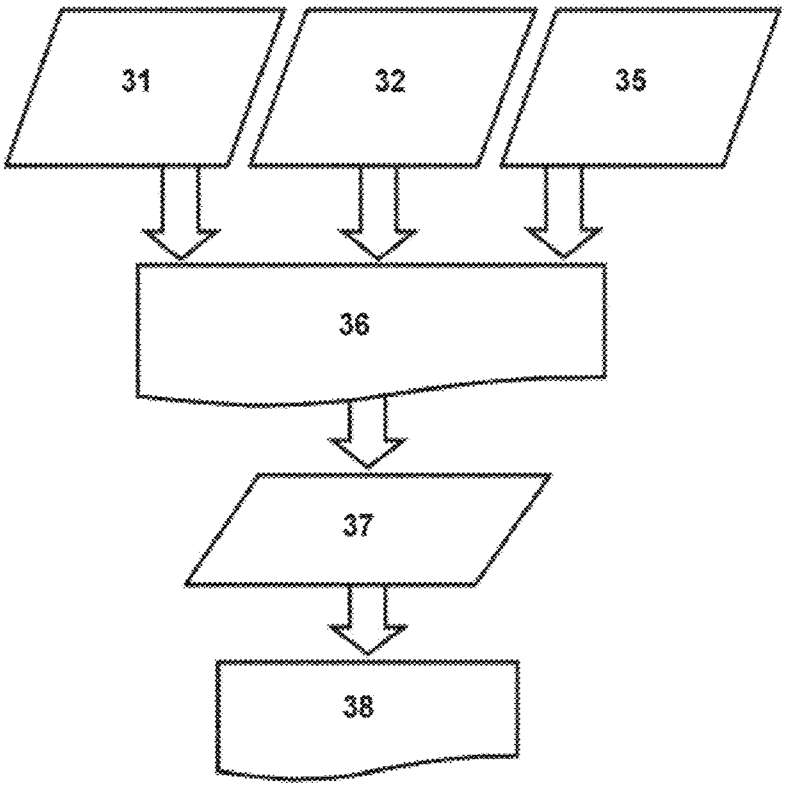
FIG. 2 is a block diagram of simulation models corresponding to the subsystems in FIG. 1, according to an embodiment.

An exemplary flow chart for simulating lithography in a lithographic projection apparatus is illustrated in FIG. 2. A source model 31 represents optical characteristics (including radiation intensity distribution or phase distribution) of the source. A projection optics model 32 represents optical characteristics (including changes to the radiation intensity distribution or the phase distribution caused by the projection optics) of the projection optics. A design layout model 35 represents optical characteristics (including changes to the radiation intensity distribution or the phase distribution caused by a given design layout) of a design layout, which is the representation of an arrangement of features on or formed by a patterning device. An aerial image 36 can be simulated from the source model 31, the projection optics model 32 and the design layout model 35. A resist image 38 can be simulated from the aerial image 36 using a resist model 37. Simulation of lithography can, for example, predict contours and CDs in the resist image.

More specifically, it is noted that the source model 31 can represent the optical characteristics of the source that include, but are not limited to, NA-sigma (a) settings as well as any particular illumination source shape (e.g. off-axis radiation sources such as annular, quadrupole, and dipole, etc.). The projection optics model 32 can represent the optical characteristics of the of the projection optics that include aberration, distortion, refractive indexes, physical sizes, physical dimensions, etc. The design layout model 35 can also represent physical properties of a physical patterning device, as described, for example, in U.S. Pat. No. 7,587,704, which is incorporated by reference in its entirety. The objective of the simulation is to accurately predict, for example, edge placements, aerial image intensity slopes and CDs, which can then be compared against an intended design. The intended design is generally defined as a pre-optical proximity correction (OPC) design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). As will be appreciated by those skilled in the art, these patterns or clips represent small portions (e.g. circuits, cells or patterns) of the design and especially the clips represent small portions for which particular attention or verification is needed. In other words, clips may be the portions of the design layout or may be similar or have a similar behavior of portions of the design layout where critical features are identified either by experience (including clips provided by a customer), by trial and error, or by running a full-chip simulation. Clips usually contain one or more test patterns or gauge patterns.

An initial larger set of clips may be provided a priori by a customer based on known critical feature areas in a design layout which require particular image optimization. Alternatively, in another embodiment, the initial larger set of clips may be extracted from the entire design layout by using some kind of automated (such as, machine vision) or manual method that identifies the critical feature areas.

In a lithographic projection apparatus, for example, using an EUV (extreme ultra-violet radiation, e.g., having a wavelength in the range 5-20 nm) source or a non-EUV source reduced radiation intensity may lead to stronger stochastic effects, such as pronounced line width roughness (LWR) and local CD variation in small two-dimensional features such as holes. In a lithographic projection apparatus using an EUV source, reduced radiation intensity may be attributed to low total radiation output from the source, radiation loss from optics that shape the radiation from the source, transmission loss through the projection optics, high photon energy that leads to fewer photons under a constant dose, etc. The stochastic effects may be attributed to factors such as photon shot noise, photon-generated secondary electrons, photon absorption variation, photon-generated acids in the resist. The small sizes of features for which EUV is called for further compound these stochastic effects. The stochastic effects in smaller features are a significant factor in production yield and justifies inclusion in a variety of optimization processes of the lithographic projection apparatus.

Under the same radiation intensity, lower exposure time of each substrate leads to higher throughput of a lithographic projection apparatus but stronger stochastic effect. The photon shot noise in a given feature under a given radiation intensity is proportional to the square root of the exposure time. The desire to lower exposure time for the purpose of increasing the throughput exists in lithography using EUV and other radiation sources. Therefore, the methods and apparatuses described herein that consider the stochastic effect in the optimization process are not limited to EUV lithography.

The throughput can also be affected by the total amount of light directed to the substrate. In some lithographic projection apparatuses, a portion of the light from the source is sacrificed in order to achieve desired shapes of the source.

Figure 3:
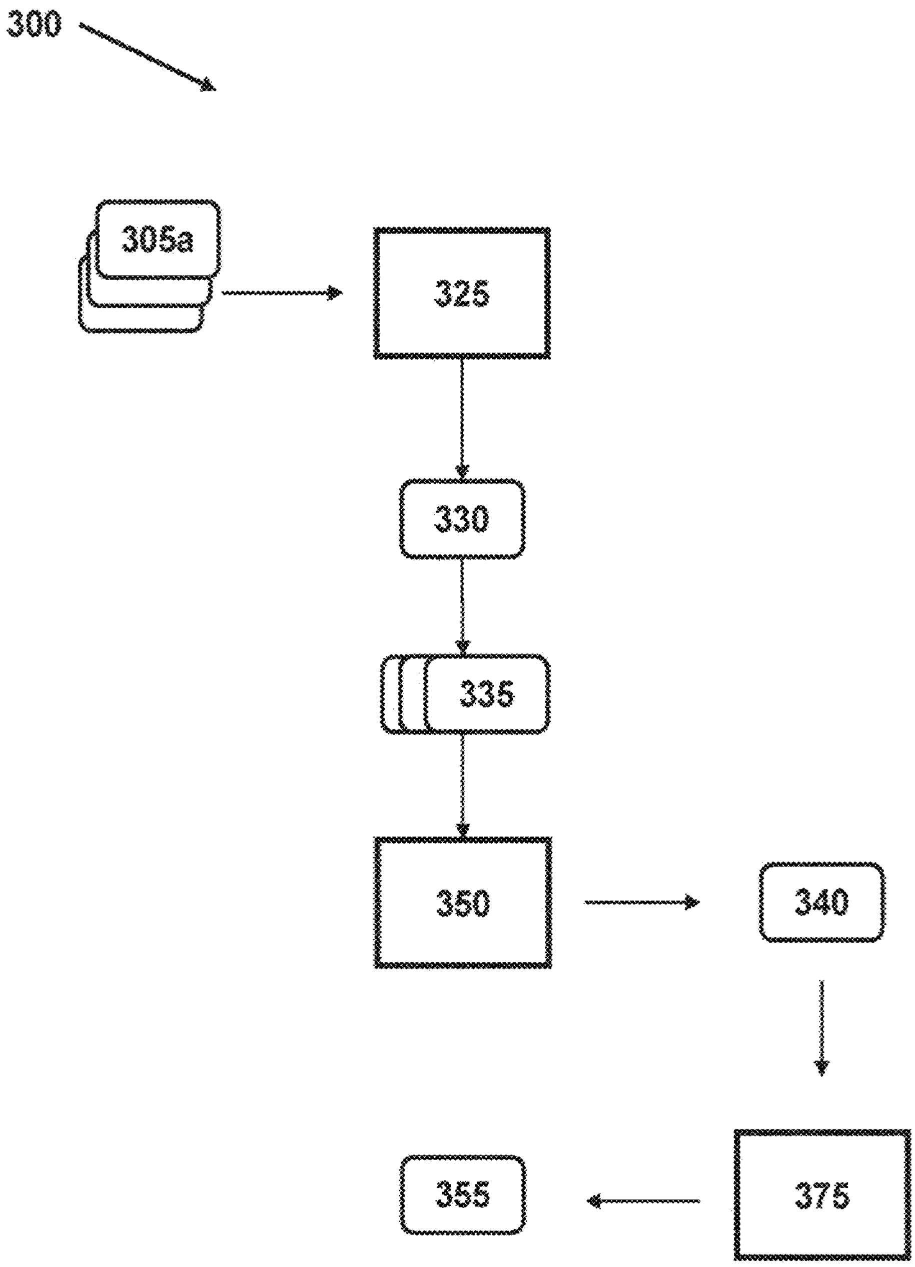
FIG. 3 is a block diagram of an exemplary system for determining a value of a design variable to be used in a lithographic process based on predicted failure rates of a pattern, consistent with various embodiments.
Figure 4:
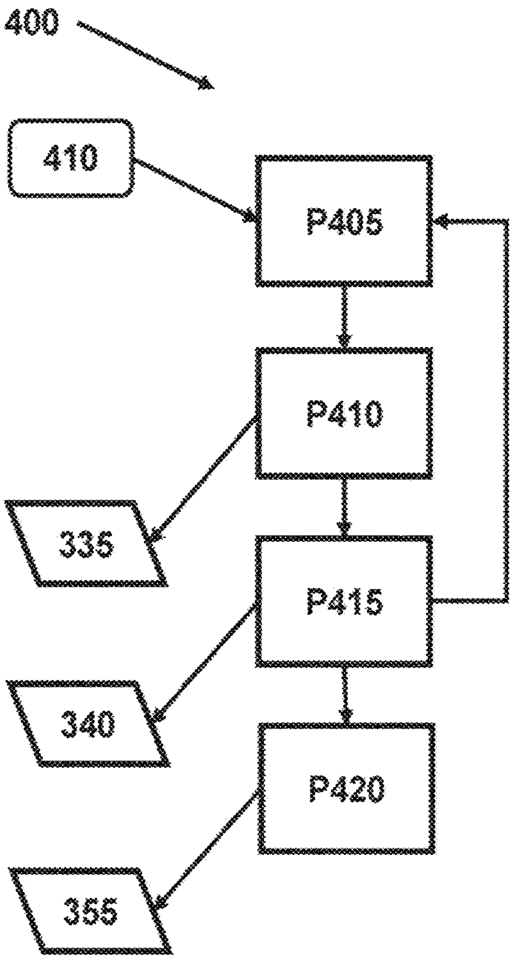
FIG. 4 is a flow diagram of an exemplary method for determining a value of a design variable to be used in a lithographic process based on predicted failure rates of a pattern, consistent with various embodiments.

The following paragraphs describe a system and a method to predict failure rates in a lithographic process using an image associated with a target pattern, and to determine a value of a design variable based on the predicted failure rate to be used in a lithographic process to print a target pattern on a substrate. FIG. 3 is a block diagram of an exemplary system 300 for determining a value of a design variable to be used in a lithographic process based on predicted failure rates of a pattern, consistent with various embodiments. FIG. 4 is a flow diagram of an exemplary method 400 for determining a value of a design variable to be used in a lithographic process based on predicted failure rates of a pattern, consistent with various embodiments.

At process P405, an image model 325 obtains image data 410. The image data 410 may include any of various types of images associated with a target pattern to be printed on a substrate. For example, the image data 410 may include an aerial image, a resist image, an etch image, a mask image or other such image representing the target pattern. In some embodiments, the image data 410 may include an aerial image 330 associated with the target pattern. In some embodiments, the image model 325 generates the aerial image 330 based on a set of values 305*a* of design variables associated with a lithographic process or lithographic apparatus. A design variable may include one or more of a target CD of the target pattern, a mask bias, a mask type (e.g., binary mask, optical mask, EUV mask, etc.), a pupil of an illumination source of the lithographic apparatus, a dose of the illumination source, or a focus associated with radiation from the illumination source, or any other suitable variables that can be optimized in an OPC or SMO process. The set of values 305*a* of the design variables may be provided as an input by a user or by any other means. The image model 325 may generate the aerial image 330 in any suitable manner that is well known in the art without departing from the scope of the present disclosure. For example, the image model 325 may be implemented using one or more of the source model 31, projection optics model 32, design layout model 35, or resist model 37 of FIG. 2 to obtain the aerial image 330 based on the set of values 305*a*. In some embodiments, the image model 325 may be configured (e.g., calibrated or trained) to generate an aerial image based on a set of values of the design variables. For example, mean CD data may be obtained (e.g., via a metrology tool or another source) for various patterns for different process conditions (e.g., different focus and dose values) and provided as an input to the image model 325 to train the image model 325 to generate an aerial image for each of the patterns. The mean CD data may be obtained for a given pupil or for multiple pupils of an illumination source for training the image model 325.

At process P410, image properties 335 are determined from the image data 410. For example, image properties 335 such as (a) a product of peak intensity and dose, (b) a product of intensity integral and dose, or (c) image log slope are extracted from the aerial image 330 (e.g., by a failure rate model 350). The image properties 335 may be representative of a pattern corresponding to the target pattern printed on the substrate. The image model 325 may use any of a number of methods in determining the image properties 335 from the image data 410.

At process P415, the failure rate model 350 predicts a failure rate 340 of the target pattern based on the image properties 335. In some embodiments, a failure rate is defined as a number of occurrences of a pattern that failed to print on a substrate (e.g., according to the intended design) relative to the total number of occurrences of the pattern on the substrate. In some embodiments, a failure rate is defined as the probability that a pattern fails to print on a substrate (e.g., according to the intended design). In some embodiments, the failure rate model 350 predicts the failure rate 340 of the target pattern for different process window conditions, for example, for different focus and dose values, thereby generating a failure rate process window. That is, in some embodiments, for a given aerial image 330 (e.g., generated for a given set of values of design variables), a number of failure rates are predicted and each predicted failure rate is associated with a specific dose and focus value. In some embodiments, the process (e.g., process P405-P415) may be repeated for a number of aerial images (e.g., generated for different sets of values of design variables) of the target pattern to generate failure rate process windows for different aerial images.

In some embodiments, the failure rate model 350 may be configured (e.g., calibrated or trained) in order to predict the failure rate for any given pattern. The failure rate model 350 may be a machine learning (ML) model or a non-ML model (e.g., a physical model, an empirical model, a semi-empirical model, etc.) that is configured to predict a failure rate based on image properties of an image associated with a pattern, such as the image properties 335 of the aerial image 330. For example, the failure rate model 350 may be configured using a training dataset, which includes data such as (a) image properties of an aerial image associated with a given pattern, and (b) measured failure rate data of the given pattern. The failure rate model 350 may be trained with a number of such training datasets having data associated with different aerial images of the given pattern, which are generated using different sets of values of design variables. Further, the failure rate model 350 may be trained with training datasets having data associated with a number of such patterns. The measured failure rate data may be obtained from a number of sources such as from a scanned electron microscope (SEM) (e.g., by inspecting a patterned substrate) or other metrology tools. In some embodiments, configuring the failure rate model 350 to predict the failure rate includes correlating image properties of an aerial image associated with a given pattern with the measured failure rate of the given pattern to generate a function that is indicative of the relationship between the image properties and the measured failure rate of the given pattern. After the failure rate model 350 is calibrated with a number of training datasets, the function determined by the failure rate model 350 may aid in predicting a failure rate for any given pattern based on the image properties of an aerial image associated with the given pattern. Additional details with reference to configuring the failure rate model 350 to correlate measured failure rates to image properties of an aerial image is described at least with reference to U.S. Pat. No. 10,545,411, which is hereby incorporated by reference in its entirety.

At process P420, a design variable selection model 375 determines a specified value 355 of a specified design variable to be used in a lithographic process for printing the target pattern on a substrate based on the predicted failure rates 340. The design variable selection model 375 may be configured to determine the specified value 355 of the design variable in a number of ways. For example, the design variable selection model 375 may be configured to select a value of a design variable for which the predicted failure rate 340 satisfies a failure rate condition as the specified value 355. In some embodiments, the failure rate condition may include a threshold failure rate or a range of failure rates, and the predicted failure rate 340 may satisfy the failure rate condition if it is below the threshold failure rate or within the range of failure rates. In another example, the design variable selection model 375 may be configured to select a value of a design variable for which a predicted throughput value satisfies a throughput condition as the specified value 355. In some embodiments, the throughput condition may include a threshold throughput value, and the predicted throughput value may satisfy the throughput condition if it exceeds the threshold throughput value. In some embodiments, the design variable selection model 375 may interact with a throughput model to determine a predicted throughput. The throughput model may take as input one or more of mask bias, dose, or focus values among other input data to determine a predicted throughput.

In another example, the design variable selection model 375 may be configured to select a value of a design variable for which a predicted local CD uniformity (LCDU) value satisfies a LCDU condition as the specified value 355. In some embodiments, the LCDU condition may include a threshold LCDU value, and the predicted LCDU value may satisfy the LCDU condition if it is below the threshold LCDU value.

Figure 5:
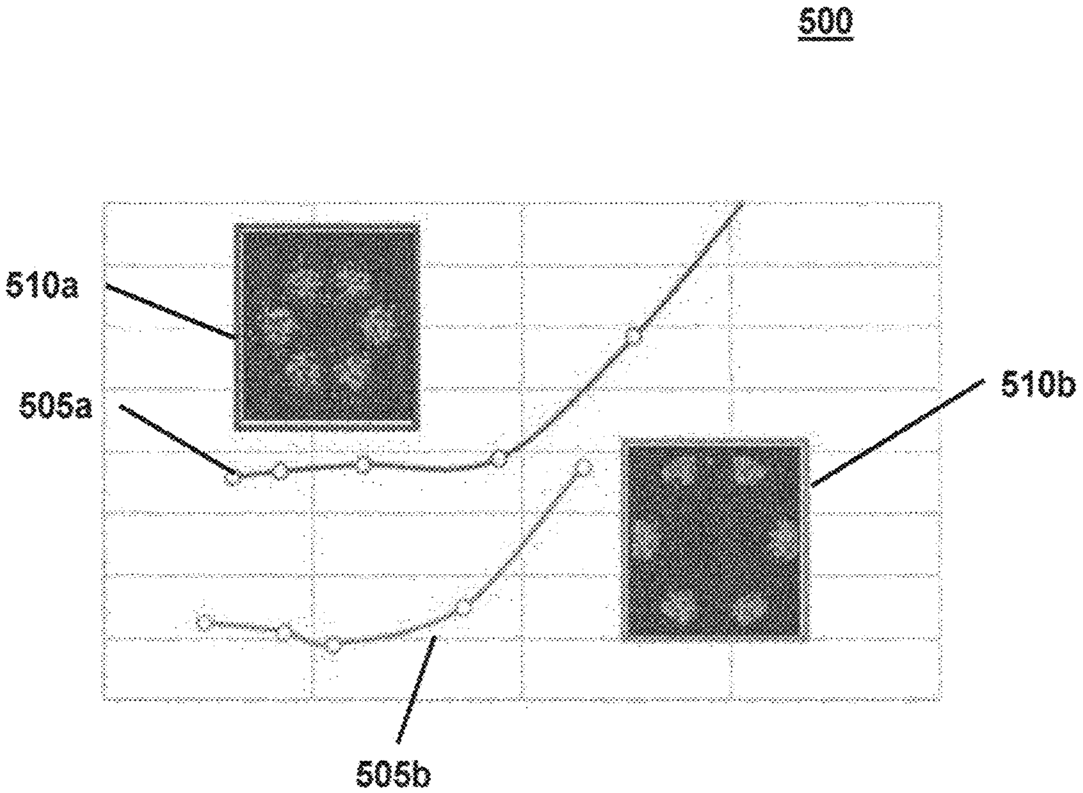
FIG. 5 shows a graph illustrating a relationship between failure rate and throughput, consistent with various embodiments.

The design variable values may be selected based on various selection criteria (e.g., indicative of relationships between different parameters of a lithographic process or apparatus). Further, different design variable values may be selected in different ways. FIG. 5 is one such example which illustrates selection of mask bias or pupil value based on throughput and predicted failure rate. FIG. 5 shows a graph 500 illustrating a relationship between failure rate and throughput, consistent with various embodiments. In some embodiments, the design variable selection model 375 may determine such a throughput-failure rate relationship based on the predicted failure rates (e.g., predicted using the failure rate model 350) for various aerial images associated with the target pattern. The x-axis of the graph 500 corresponds to throughput and the y-axis corresponds to a failure rate. A first curve 505*a* illustrates a relationship between the throughput and failure rate of a given pattern for a first pupil 510*a*, and a second curve 505*b* illustrates a relationship between the throughput and failure rate of the given pattern for a second pupil 510*b*. In some embodiments, a throughput of the lithographic process is dependent on a mask bias—the greater the mask bias, the higher the throughput. Accordingly, the throughput may be controlled by adjusting a mask bias (e.g., to achieve a higher throughput, the mask bias may be increased). However, as indicated by the throughput-failure rate relationship in the graph 500, the failure rate increases as the throughput increases. Accordingly, the design variable selection model 375 may select the mask bias value for which the predicted failure rate satisfies the failure rate condition (e.g., user-specified or determined otherwise). In some embodiments, the design variable selection model 375 may select the mask bias value for which a predicted throughput value satisfies a throughput condition (e.g., user-specified or determined otherwise) in addition to the predicted failure rate satisfying the failure rate condition. Further, based on the throughput-failure rate relationship for different pupils, the design variable selection model 375 may select a specified pupil (e.g., the second pupil 510*b*) for which the predicted failure rate satisfies the failure rate condition, and in some embodiments, for which a throughput value satisfies the throughput condition in addition to the predicted failure rate satisfying the failure rate condition. Note that the failure rate decreases significantly for the second pupil 510*b*.

While some of the foregoing paragraphs describe selecting a value of a single design variable based on one or more conditions, in some embodiments, the design variable selection model 375 may select a value for one or more design variables as a trade-off between one or more lithographic metrics (e.g., a depth of focus, an exposure latitude, LCDU, failure rate, etc.) and throughput. For example, the value of one or more design variables may be selected such that a lithographic metric satisfies a specified condition (e.g., LCDU being below a threshold LCDU value, failure being below a threshold failure rate value, etc.) and a predicted throughput satisfies a throughput condition (e.g., predicted throughput valued exceeds a threshold throughput value).

In some embodiments, a lithographic process or patterning process may be performed using the selected values of the design variables to print a pattern corresponding to a target pattern on a substrate. In some embodiments, after the patterning process, CD metrology or defect inspection may be performed on the printed substrate to verify the selected values of the design variables to ensure they are satisfying the specified conditions.

Figure 6:
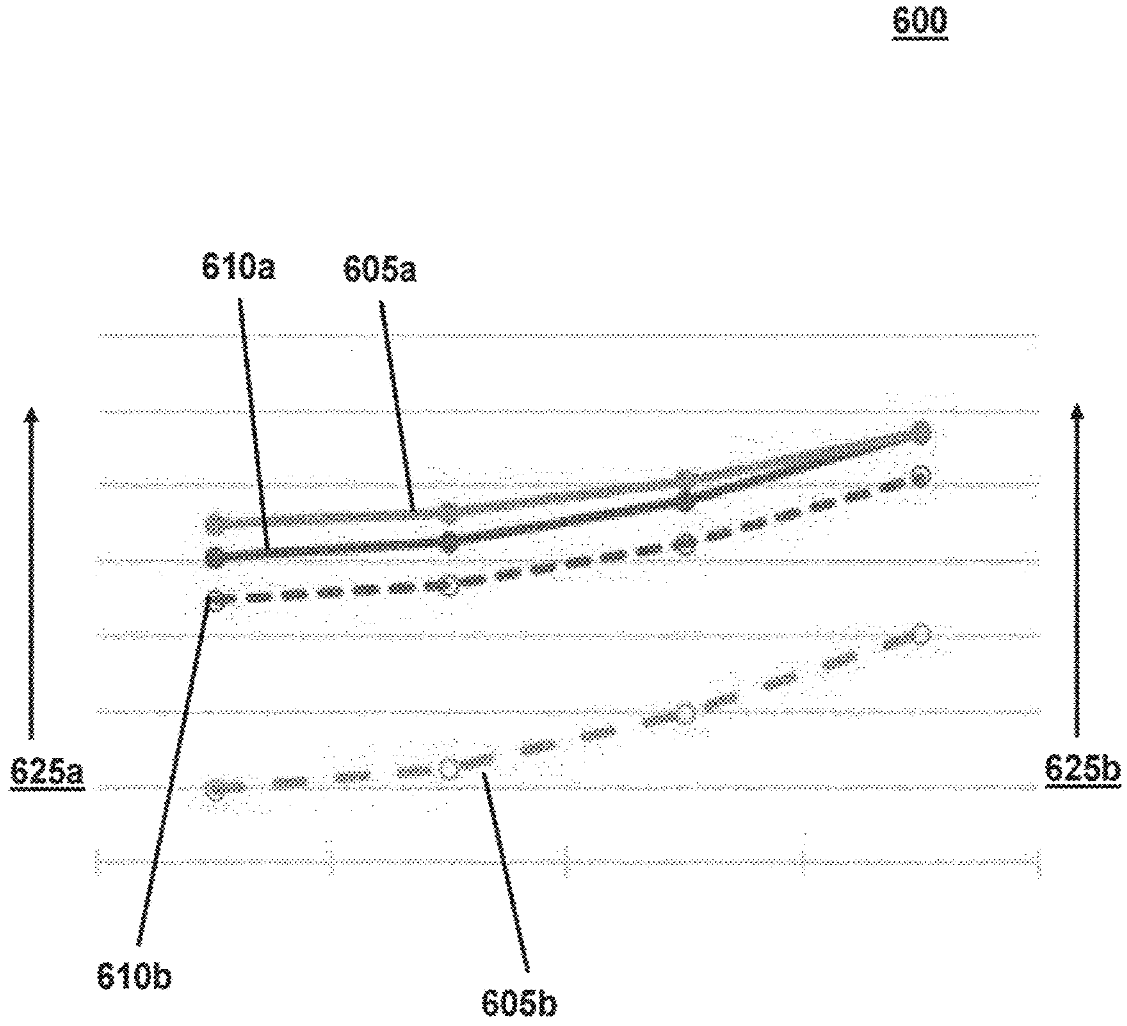
FIG. 6 shows a graph illustrating a relationship between failure rate and mask bias, and between LCDU and mask bias, consistent with various embodiments.

FIG. 6 is another example which illustrates selection of mask bias or target CD based on LCDU value and predicted failure rate. FIG. 6 shows a graph 600 illustrating a relationship between failure rate and mask bias, and between LCDU and mask bias, consistent with various embodiments. The x-axis of the graph 600 corresponds to mask bias, a first y-axis 625*a* corresponds to LCDU and a second y-axis 625*b* corresponds to a failure rate. A first curve 610*a* corresponds to a relationship between LCDU and mask bias of a given pattern with a first target CD, and a second curve 610*b* corresponds to a relationship between LCDU and mask bias of the given pattern with a second target CD greater than the first target CD. The LCDU-mask bias relationship indicates that the LCDU increases as the mask bias increases. The LCDU-mask bias relationship also indicates that for any given mask bias, the variation in LCDU between two target CDs is not significant. So, based on the LCDU-mask bias relationship, the design variable selection model 375 may select a target CD (e.g., either a first target CD or a second target CD as they do not have a significant impact on the LCDU value) for which a LCDU value satisfies a LCDU condition (e.g., user-specified or determined otherwise), and may select a mask bias value for which the LCDU value satisfies a LCDU condition.

A third curve 605*a* corresponds to a relationship between failure rate and mask bias of a given pattern for the first target CD, and a fourth curve 605*b* corresponds to a relationship between the failure rate and mask bias of the given pattern for the second target CD. The failure rate-mask bias relationship indicates that the failure rate increases as the mask bias increases, and for any given mask bias, the failure rate increases significantly as the target CD decreases. So, based on the failure rate-mask bias relationship, the design variable selection model 375 may select a target CD value (e.g., a higher target CD value such as the second target CD) for which a failure rate satisfies the failure rate condition, and may select a mask bias value for which a failure rate satisfies the failure rate condition.

In some embodiments, the design variable selection model 375 may select one or more design variable values (e.g., target CD, mask bias, pupil, dose, focus, mask type, etc.) based on the failure rates, in addition to one or more other conditions based on the relationships (e.g., the throughput-failure rate relationship, the LCDU-mask bias relationship, the failure rate-mask bias relationship, etc.) between various lithographic process or apparatus related parameters described at least with reference to FIGS. 5 and 6. The design variable selection model 375 may provide a graphical user interface (GUI) that illustrates these various relationships and how a value of the design variable or other lithographic metric is impacted when a value of one or more variables or lithographic metrics are changed.

In some embodiments, the design variable selection model 375 may also be configured to determine at least one of a source variable of an illumination source or a mask variable of a mask pattern in a source mask optimization (SMO) process based on the predicted failure rate. For example, the predicted failure rates may be used in a SMO process, such as the processes described at least with reference to FIGS. 7-10 below, in determining or optimizing at least one of the source variable (e.g., a pupil shape) or the mask variable (e.g., mask bias). In some embodiments, in the SMO process, the source or mask variables are optimized using a cost function, such as the cost function of Eq. 1, which is a function of a number of design variables. Typically, the cost function in SMO is represented as:

$$CF(z_1, z_2, \ldots, z_N) = \sum_{p=1}^{P} w_p f_p^2(z_1, z_2, \ldots, z_N) \quad \text{(Eq. 1)}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. For example, $f_p(z_1, z_2, \ldots, z_N)$ of an evaluation point can be simply a distance between a point in the resist image to an intended position of that point (i.e., edge placement error $EPE_p(z_1, z_2, \ldots, z_N)$). In some embodiments, the source or mask variables may be optimized based on a characteristic such as the $EPE_p(z_1, z_2, \ldots, z_N)$). The predicted failure rates may also be added as a characteristic to the cost function based on which the source or mask variables are optimized (e.g., determined). For example, such a cost function may be represented as:

$$CF(z_1, z_2, \ldots, z_N) = EPE_{cost} + w_{FR}\sum_{p=1}^{P}(FR - FR_{threshold})^{\wedge}n, \quad \text{(Eq. A)}$$

where $EPE_{cost}$ is the EPE related function of design variables and $$\sum_{p=1}^{P}(FR - FR_{threshold})^{\wedge}n$$

is the failure rate ("FR") related penalty function, FR is the predicted failure rate, $FR_{threshold}$ is a threshold failure rate, where $FR>FR_{threshold}$. If $FR<FR_{threshold}$, then the FR penalty function is "0." $w_{FR}$ is a weight associated with the FR function, where n is the power of the FR penalty function, and wherein the EPE function and the FR penalty functions are evaluated across all process window PW (focus/dose) conditions. Note that the EPE characteristic is just one example characteristic and other such characteristics may be incorporated into the cost function, CF, in addition to, or instead of, the EPE characteristic. Further, the cost function may include more or less characteristics (e.g., functions $f_p$ of the design variables) than illustrated in Eq. A.

In some embodiments, a gradient of the cost function in Eq. A is computed with respect to the source variables and the mask variables. The gradient function is typically indicative of how sensitive a cost function is to a change in the source variable or the mask variable. The source variable or mask variable may be optimized by minimizing the gradient functions. The gradient function may be expressed as:

$$Gm = \frac{\partial CF}{\partial m_x}, x = 1, 2, \ldots X \quad \text{(Eq. B)}$$

where Gm is gradient of the cost function with respect to a mask variable, m; $\partial$CF is a derivative of the cost function of Eq. A, $\partial m_x$ is a derivative of a mask variable, $m_x$, and where x is an index of a mask variable among X number of mask variables.

In some embodiments, optimizing the gradient function is an iterative process, and the cost function in Eq. A may be optimized (e.g., reduced) until the gradient of the cost function, Gm, is minimized. When the gradient of the cost function is minimized, the mask variable value may be considered to be optimized.

Similar to the gradient of the cost function of Eq. B, a gradient of the cost function with respect to a source variable may be computed to optimize the source variable. The gradient of the cost function may be expressed as:

$$Gs = \frac{\partial CF}{\partial s_y}, y = 1, 2, \ldots Y \quad \text{(Eq. C)}$$

where Gs is gradient of the cost function with respect to a source variable, s; $\partial s_y$ is a derivative of a source variable, $s_y$, and where y is an index of the source variable among Y number of source variables.

In some embodiments, optimizing the gradient function is an iterative process, and the cost function in Eq. A is optimized (e.g., reduced) until the gradient of the cost function with respect to the source variable is minimized. When the gradient of the cost function is minimized, the source variable value is considered to be optimized.

In some embodiments, a gradient of the predicted failure rate with respect to the aerial image may be computed to enable the SMO process based on the predicted failure rates. For example, the failure rate, FR, may be computed (e.g., by the failure rate model 350) as a function of image properties of an aerial image-FR=$f(\text{term}_1, \text{term}_2, \ldots, \text{term}_z)$. One example of such an FR function may be represented as:

$$FR = \sum_{t=1}^{z}\text{term}(AI) \quad \text{(Eq. D)}$$

Where AI represents the aerial image, term represents an aerial image property based on which the failure rate is predicted, t is an index of the image property among z number of aerial image properties considered for determining the failure rate.

A gradient of the failure rate for an aerial image with respect to a mask variable may be represented as follows:

$$GFRm = \sum_{t=1}^{z}\frac{\partial term_t}{\partial m_x}, x = 1, 2, \ldots X \quad \text{(Eq. E)}$$

where GFRm is gradient of the failure rate for an aerial image with respect to a mask variable, m; $\partial m_x$ is a derivative of a mask variable, $m_x$, and where x is an index of the mask variable among X number of mask variables. In some embodiments, the $$\frac{\partial term_t}{\partial m_x}$$

may also be expressed as:

$$\frac{\partial term_t}{\partial AI} * \frac{\partial AI}{\partial m_x}.$$

A gradient of the failure rate for an aerial image with respect to a source variable may be represented as follows:

$$GFRs = \sum_{t=1}^{z}\frac{\partial term_t}{\partial s_y}, y = 1, 2, \ldots Y \quad \text{(Eq. F)}$$

where GFRs is gradient of the failure rate with respect to a source variable, s; $\partial s_y$ is a derivative of a source variable, $s_y$, and where y is an index of the source variable among Y number of source variables. In some embodiments, the $$\frac{\partial term_t}{\partial s_y}$$

may also be expressed as:

$$\frac{\partial term_t}{\partial AI} * \frac{\partial AI}{\partial s_y}.$$

In some embodiments, optimizing the design variable is an iterative process, and the cost function in Eq. A is optimized (e.g., reduced) until the gradient of the cost function with respect to the source variable or the mask variable is minimized. When the gradient of the cost function is minimized, the source variable or the mask variable is considered to be optimized.

The following paragraphs describe various methods of source mask optimization. In order to ensure that the projected image of the design layout is in accordance with requirements of a given target circuit design, optimization to design layouts or patterning devices (e.g., OPC) may be performed. In addition to the OPC, the illumination source can also be optimized, either jointly with patterning device optimization or separately, in an effort to improve the overall lithography fidelity. The terms "illumination source" and "source" are used interchangeably in this document. Since the 1990s, many off-axis illumination sources, such as annular, quadrupole, and dipole, have been introduced, and have provided more freedom for OPC design, thereby improving the imaging results, As is known, off-axis illumination is a proven way to resolve fine structures (i.e., target features) contained in the patterning device. However, when compared to a traditional illumination source, an off-axis illumination source usually provides less radiation intensity for the aerial image (AI). Thus, it becomes desirable to attempt to optimize the illumination source to achieve the optimal balance between finer resolution and reduced radiation intensity.

Numerous illumination source optimization approaches can be found, for example, in an article by Rosenbluth et al., titled "Optimum Mask and Source Patterns to Print A Given Shape", Journal of Microlithography, Microfabrication, Microsystems 1(1), pp. 13-20, (2002). The source is partitioned into several regions, each of which corresponds to a certain region of the pupil spectrum. Then, the source distribution is assumed to be uniform in each source region and the brightness of each region is optimized for process window. However, such an assumption that the source distribution is uniform in each source region is not always valid, and as a result the effectiveness of this approach suffers. In another example set forth in an article by Granik, titled "Source Optimization for Image Fidelity and Throughput", Journal of Microlithography, Microfabrication, Microsystems 3(4), pp. 509-522, (2004), several existing source optimization approaches are overviewed and a method based on illuminator pixels is proposed that converts the source optimization problem into a series of non-negative least square optimizations. Though these methods have demonstrated some successes, they typically require multiple complicated iterations to converge. In addition, it may be difficult to determine the appropriate/optimal values for some extra parameters, such as y in Granik's method, which dictates the trade-off between optimizing the source for substrate image fidelity and the smoothness requirement of the source.

For low $k_1$ photolithography, optimization of both the source and patterning device is useful to ensure a viable process window for projection of critical circuit patterns. Some algorithms (e.g. Socha et. al. Proc. SPIE vol. 5853, 2005, p. 180) discretize illumination into independent source points and mask into diffraction orders in the spatial frequency domain, and separately formulate a cost function (which is defined as a function of selected design variables) based on process window metrics such as exposure latitude which could be predicted by optical imaging models from source point intensities and patterning device diffraction orders. The term "design variables" as used herein comprises a set of parameters of a lithographic projection apparatus or a lithographic process, for example, parameters a user of the lithographic projection apparatus can adjust, or image characteristics a user can adjust by adjusting those parameters. It should be appreciated that any characteristics of a lithographic projection process, including those of the source, the patterning device, the projection optics, or resist characteristics can be among the design variables in the optimization. The cost function is often a non-linear function of the design variables. Then standard optimization techniques are used to minimize the cost function.

Relatedly, the pressure of ever decreasing design rules have driven semiconductor chipmakers to move deeper into the low $k_1$ lithography era with existing 193 nm ArF lithography. Lithography towards lower $k_1$ puts heavy demands on RET, exposure tools, and the need for litho-friendly design. 1.35 ArF hyper numerical aperture (NA) exposure tools may be used in the future. To help ensure that circuit design can be produced on to the substrate with workable process window, source-patterning device optimization (referred to herein as source-mask optimization or SMO) is becoming a significant RET for 2× nm node.

A source and patterning device (design layout) optimization method and system that allows for simultaneous optimization of the source and patterning device using a cost function without constraints and within a practicable amount of time is described in a commonly assigned International Patent Application published as WO2010/059954, titled "Fast Freeform Source and Mask Co-Optimization Method", which is hereby incorporated by reference in its entirety.

Another source and mask optimization method and system that involves optimizing the source by adjusting pixels of the source is described in a commonly assigned U.S. Patent Application Publication No. 2010/0315614, titled "Source-Mask Optimization in Lithographic Apparatus", which is hereby incorporated by reference in its entirety.

In a lithographic projection apparatus, as an example, a cost function is expressed as $$CF(z_1, z_2, \ldots, z_N) = \sum_{p=1}^{P} w_p f_p^2(z_1, z_2, \ldots, z_N) \tag{Eq. 1}$$

wherein $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic at an evaluation point for a set of values of the design variables of $(z_1, z_2, \ldots, z_N)$. $w_p$ is a weight constant associated with $f_p(z_1, z_2, \ldots, z_N)$. An evaluation point or pattern more critical than others can be assigned a higher $w_p$ value. Patterns or evaluation points with larger number of occurrences may be assigned a higher $w_p$ value, too. Examples of the evaluation points can be any physical point or pattern on the substrate, any point on a virtual design layout, or resist image, or aerial image, or a combination thereof. $f_p(z_1, z_2, \ldots, z_N)$ can also be a function of one or more stochastic effects such as the LWR, which are functions of the design variables ($z_1, z_2, \ldots, z_N$). The cost function may represent any suitable characteristics of the lithographic projection apparatus or the substrate, for instance, failure rate of a feature, focus, CD, image shift, image distortion, image rotation, stochastic effects, throughput, CDU, or a combination thereof. CDU is local CD variation (e.g., three times of the standard deviation of the local CD distribution). CDU may be interchangeably referred to as LCDU. In one embodiment, the cost function represents (i.e., is a function of) CDU, throughput, and the stochastic effects. In one embodiment, the cost function represents (i.e., is a function of) EPE, throughput, and the stochastic effects. In one embodiment, the design variables ($z_1, z_2, \ldots, z_N$) comprise dose, global bias of the patterning device, shape of illumination from the source, or a combination thereof. Since it is the resist image that often dictates the circuit pattern on a substrate, the cost function often includes functions that represent some characteristics of the resist image. For example, $f_p(z_1, z_2, \ldots, z_N)$ of such an evaluation point can be simply a distance between a point in the resist image to an intended position of that point (i.e., edge placement error $EPE_p(z_1, z_2, \ldots, z_N)$). The design variables can be any adjustable parameters such as adjustable parameters of the source, the patterning device, the projection optics, dose, focus, etc. The projection optics may include components collectively called as “wavefront manipulator” that can be used to adjust shapes of a wavefront and intensity distribution or phase shift of the irradiation beam. The projection optics preferably can adjust a wavefront and intensity distribution at any location along an optical path of the lithographic projection apparatus, such as before the patterning device, near a pupil plane, near an image plane, near a focal plane. The projection optics can be used to correct or compensate for certain distortions of the wavefront and intensity distribution caused by, for example, the source, the patterning device, temperature variation in the lithographic projection apparatus, thermal expansion of components of the lithographic projection apparatus. Adjusting the wavefront and intensity distribution can change values of the evaluation points and the cost function. Such changes can be simulated from a model or actually measured. Of course, $CF(z_1, z_2, \ldots, z_N)$ is not limited the form in Eq. 1. $CF(z_1, z_2, \ldots, z_N)$ can be in any other suitable form.

It should be noted that the normal weighted root mean square (RMS) of $f_p(z_1, z_2, \ldots, z_N)$ is defined as $$\sqrt{\frac{1}{P}\sum_{p=1}^{P} w_p f_p^2(z_1, z_2, \ldots, z_N)},$$

therefore, minimizing the weighted RMS of $f_p(z_1, z_2, \ldots, z_N)$ is equivalent to minimizing the cost function $$CF(z_1, z_2, \ldots, z_N) = \sum_{p=1}^{P} w_p f_p^2(z_1, z_2, \ldots, z_N),$$

defined in Eq. 1. Thus the weighted RMS of $f_p(z_1, z_2, \ldots, z_N)$ and Eq. 1 may be utilized interchangeably for notational simplicity herein.

Further, if considering maximizing the PW (Process Window), one can consider the same physical location from different PW conditions as different evaluation points in the cost function in (Eq.1). For example, if considering N PW conditions, then one can categorize the evaluation points according to their PW conditions and write the cost functions as:

$$CF(z_1, z_2, \ldots, z_N) = \sum_{p=1}^{P} w_p f_p^2(z_1, z_2, \ldots, z_N) = \sum_{u=1}^{U}\sum_{p_u=1}^{P_u} w_{p_u} f_p^2(z_1, z_2, \ldots, z) \quad \text{(Eq. 1')}$$

Where $f_{p_u}(z_1, z_2, \ldots, z_N)$ is the value of $f_p(z_1, z_2, \ldots, z_N)$ under the u-th PW condition u=1, . . . , U. When $f_p(z_1, z_2, \ldots, z_N)$ is the EPE, then minimizing the above cost function is equivalent to minimizing the edge shift under various PW conditions, thus this leads to maximizing the PW. In particular, if the PW also consists of different mask bias, then minimizing the above cost function also includes the minimization of MEEF (Mask Error Enhancement Factor), which is defined as the ratio between the substrate EPE and the induced mask edge bias.

The design variables may have constraints, which can be expressed as $(z_1, z_2, \ldots, z_N) \in Z$, where Z is a set of possible values of the design variables. One possible constraint on the design variables may be imposed by yield or a desired throughput of the lithographic projection apparatus. The desired yield or throughput may limit the dose and thus has implications for the stochastic effects (e.g., imposing a lower bound on the stochastic effects). Higher throughput generally leads to lower dose, shorter longer exposure time and greater stochastic effects. Higher yield generally leads to a restricted design which may be sensitive to stochastic risk. Consideration of substrate throughput, yield and minimization of the stochastic effects may constrain the possible values of the design variables because the stochastic effects are function of the design variables. Without such a constraint imposed by the desired throughput, the optimization may yield a set of values of the design variables that are unrealistic. For example, if the dose is among the design variables, without such a constraint, the optimization may yield a dose value that makes the throughput economically impossible. However, the usefulness of constraints should not be interpreted as a necessity. The throughput may be affected by the failure rate based adjustment to parameters of the patterning process. It is desirable to have lower failure rate of the feature while maintaining a high throughput. Throughput may also be affected by the resist chemistry. Slower resist (e.g., a resist that requires higher amount of light to be properly exposed) leads to lower throughput. Thus, based on the optimization process involving failure rate of a feature due to resist chemistry or fluctuations, and dose requirements for higher throughput, appropriate parameters of the patterning process may be determined.

The optimization process therefore is to find a set of values of the design variables, under the constraints $(z_1, z_2, \ldots, z_N) \in Z$, that minimize the cost function, i.e., to find $$(\tilde{z}_1, \tilde{z}_2, \ldots, \tilde{z}_N) = \underset{(z_1, z_2, \ldots, z_N) \in Z}{\operatorname{argmin}} CF(z_1, z_2, \ldots, z_N) = \quad \text{(Eq. 2)}$$

-continued $$\underset{(z_1,z_2,\ldots,z_N)\in Z}{\operatorname{argmin}} \sum_{p=1}^{P} w_p f_p^2(z_1, z_2, \ldots, z_N)$$

Figure 7:
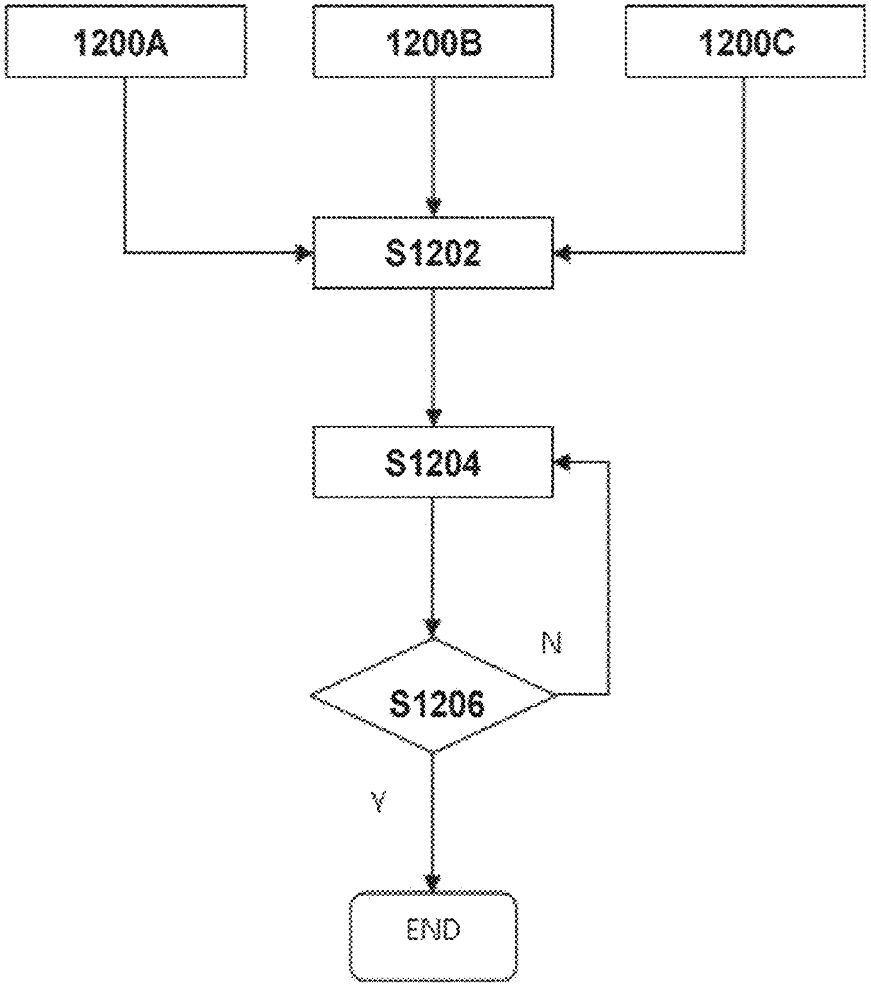
FIG. 7 is a flow diagram illustrating aspects of an example methodology of joint optimization, according to an embodiment.

A general method of optimizing the lithography projection apparatus, according to an embodiment, is illustrated in FIG. 7. This method comprises a step S1202 of defining a multi-variable cost function of a plurality of design variables. The design variables may comprise any suitable combination selected from characteristics of the illumination source (1200A) (e.g., pupil fill ratio, namely percentage of radiation of the source that passes through a pupil or aperture), characteristics of the projection optics (1200B) and characteristics of the design layout (1200C). For example, the design variables may include characteristics of the illumination source (1200A) and characteristics of the design layout (1200C) (e.g., global bias) but not characteristics of the projection optics (1200B), which leads to an SMO. Alternatively, the design variables may include characteristics of the illumination source (1200A), characteristics of the projection optics (1200B) and characteristics of the design layout (1200C), which leads to a source-mask-lens optimization (SMLO). In step S1204, the design variables are simultaneously adjusted so that the cost function is moved towards convergence. In step S1206, it is determined whether a predefined termination condition is satisfied. The predetermined termination condition may include various possibilities, i.e. the cost function may be minimized or maximized, as required by the numerical technique used, the value of the cost function has been equal to a threshold value or has crossed the threshold value, the value of the cost function has reached within a preset error limit, or a preset number of iteration is reached. If either of the conditions in step S1206 is satisfied, the method ends. If none of the conditions in step S1206 is satisfied, the step S1204 and S1206 are iteratively repeated until a desired result is obtained. The optimization does not necessarily lead to a single set of values for the design variables because there may be physical restraints caused by factors such as the failure rates, the pupil fill factor, the resist chemistry, the throughput, etc. The optimization may provide multiple sets of values for the design variables and associated performance characteristics (e.g., the throughput) and allows a user of the lithographic apparatus to pick one or more sets.

In a lithographic projection apparatus, the source, patterning device and projection optics can be optimized alternatively (referred to as Alternative Optimization) or optimized simultaneously (referred to as Simultaneous Optimization). The terms “simultaneous”, “simultaneously”, “joint” and “jointly” as used herein mean that the design variables of the characteristics of the source, patterning device, projection optics or any other design variables, are allowed to change at the same time. The term “alternative” and “alternatively” as used herein mean that not all of the design variables are allowed to change at the same time.

Figure 8:
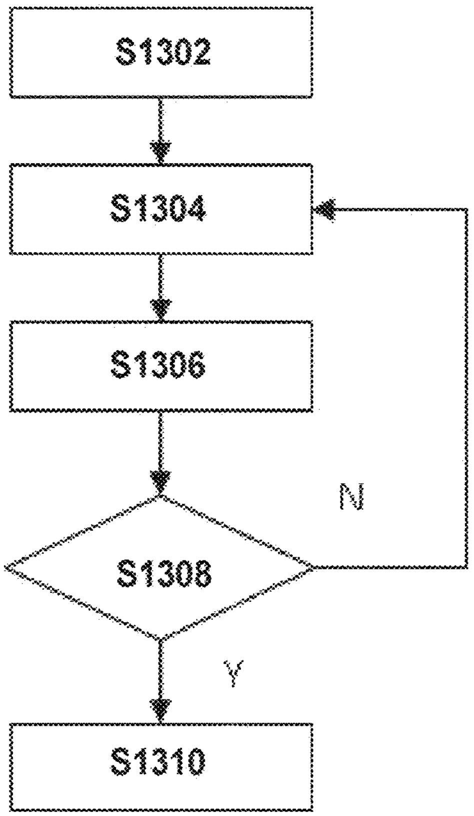
FIG. 8 shows an embodiment of another optimization method, according to an embodiment.

In FIG. 8, the optimization of all the design variables is executed simultaneously. Such flow may be called the simultaneous flow or co-optimization flow. Alternatively, the optimization of all the design variables is executed alternatively, as illustrated in FIG. 8. In this flow, in each step, some design variables are fixed while the other design variables are optimized to minimize the cost function; then in the next step, a different set of variables are fixed while the others are optimized to minimize the cost function. These steps are executed alternatively until convergence or certain terminating conditions are met.

As shown in the non-limiting example flowchart of FIG. 8, first, a design layout (step S1302) is obtained, then a step of source optimization is executed in step S1304, where all the design variables of the illumination source are optimized (SO) to minimize the cost function while all the other design variables are fixed. Then in the next step S1306, a mask optimization (MO) is performed, where all the design variables of the patterning device are optimized to minimize the cost function while all the other design variables are fixed. These two steps are executed alternatively, until certain terminating conditions are met in step S1308. Various termination conditions can be used, such as, the value of the cost function becomes equal to a threshold value, the value of the cost function crosses the threshold value, the value of the cost function reaches within a preset error limit, or a preset number of iteration is reached, etc. Note that SO-MO-Alternative-Optimization is used as an example for the alternative flow. The alternative flow can take many different forms, such as SO-LO-MO-Alternative-Optimization, where SO, LO (Lens Optimization) is executed, and MO alternatively and iteratively; or first SMO can be executed once, then execute LO and MO alternatively and iteratively; and so on. Finally, the output of the optimization result is obtained in step S1310, and the process stops.

The pattern selection algorithm, as discussed before, may be integrated with the simultaneous or alternative optimization. For example, when an alternative optimization is adopted, first a full-chip SO can be performed, the ‘hot spots’ or ‘warm spots’ are identified, then an MO is performed. In view of the present disclosure numerous permutations and combinations of sub-optimizations are possible in order to achieve the desired optimization results.

Figure 9A:
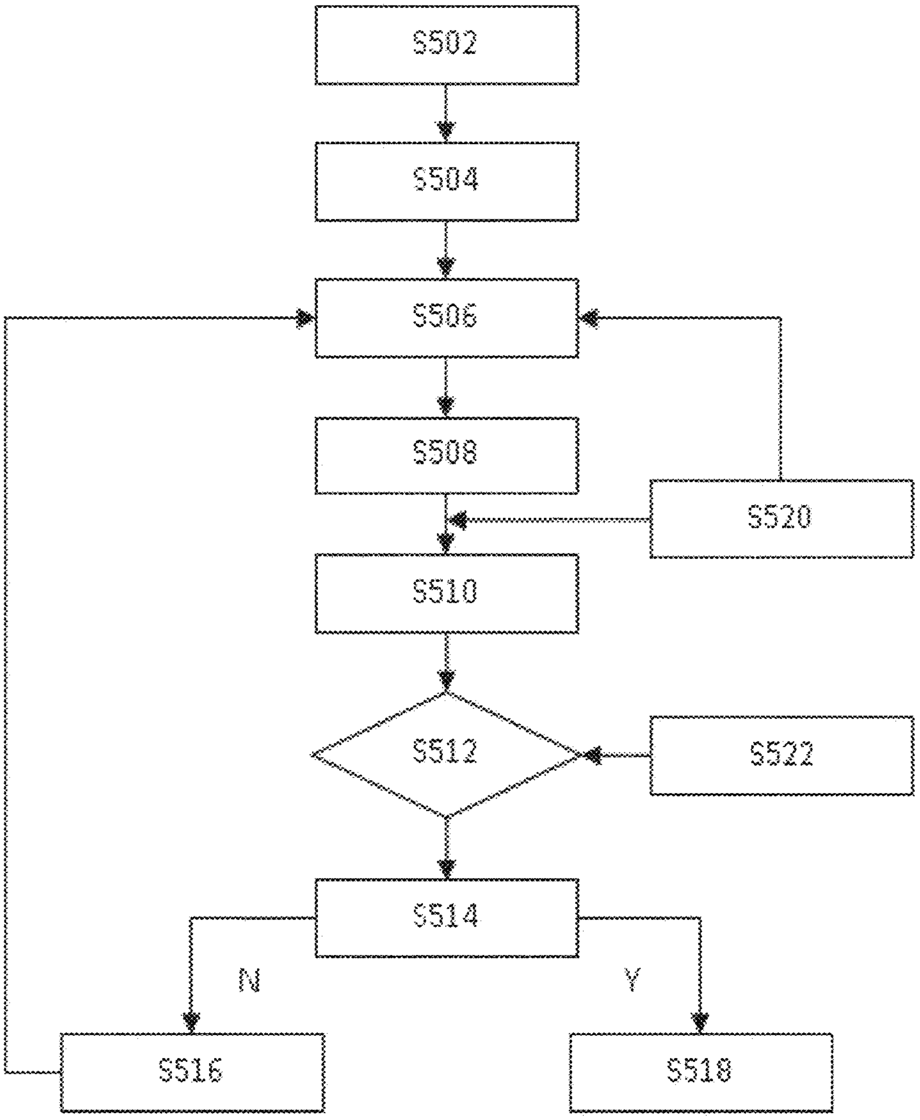
FIGS. 9A, 9B and 10 show example flowcharts of various optimization processes, according to an embodiment.

FIG. 9A shows one exemplary method of optimization, where a cost function is minimized. In step S502, initial values of design variables are obtained, including their tuning ranges, if any. In step S504, the multi-variable cost function is set up. In step S506, the cost function is expanded within a small enough neighborhood around the starting point value of the design variables for the first iterative step (i=0). In step S508, standard multi-variable optimization techniques are applied to minimize the cost function. Note that the optimization problem can apply constraints, such as tuning ranges, during the optimization process in S508 or at a later stage in the optimization process. Step S520 indicates that each iteration is done for the given test patterns (also known as “gauges”) for the identified evaluation points that have been selected to optimize the lithographic process. In step S510, a lithographic response is predicted. In step S512, the result of step S510 is compared with a desired or ideal lithographic response value obtained in step S522. If the termination condition is satisfied in step S514, i.e. the optimization generates a lithographic response value sufficiently close to the desired value, and then the final value of the design variables is outputted in step S518. The output step may also include outputting other functions using the final values of the design variables, such as outputting a wavefront aberration-adjusted map at the pupil plane (or other planes), an optimized source map, and optimized design layout etc. If the termination condition is not satisfied, then in step S516, the values of the design variables is updated with the result of the i-th iteration, and the process goes back to step S506. The process of FIG. 9A is elaborated in details below.

In an exemplary optimization process, no relationship between the design variables $(z_1, z_2, \ldots, z_N)$ and $f_p(z_1, z_2, \ldots, z_N)$ is assumed or approximated, except that $f_p(z_1, z_2, \ldots, z_N)$ is sufficiently smooth (e.g. first order derivatives $$\frac{\partial f_p(z_1, z_2, \ldots, z_N)}{\partial z_n},$$

n=1, 2, . . . N) exist), which is generally valid in a lithographic projection apparatus. An algorithm, such as the Gauss-Newton algorithm, the Levenberg-Marquardt algorithm, the gradient descent algorithm, simulated annealing, the genetic algorithm, can be applied to find $(\tilde{z}_1, \tilde{z}_2, \ldots, \tilde{z}_N)$.

Here, the Gauss-Newton algorithm is used as an example. The Gauss-Newton algorithm is an iterative method applicable to a general non-linear multi-variable optimization problem. In the i-th iteration wherein the design variables $(z_1, z_2, \ldots, z_N)$ take values of $(z_{1i}, z_{2i}, \ldots, z_{Ni})$, the Gauss-Newton algorithm linearizes $(z_1, z_2, \ldots, z_N)$ in the vicinity of $(z_{1i}, z_{2i}, \ldots, z_{Ni})$, and then calculates values $(z_{1(i+1)}, z_{2(i+1)}, \ldots, z_{N(i+1)})$ in the vicinity of $(z_{1i}, z_{2i}, \ldots, z_{Ni})$ that give a minimum of $CF(z_1, z_2, \ldots, z_N)$. The design variables $(z_1, z_2, \ldots, z_N)$ take the values of $(z_{1(i+1)}, z_{2(i+1)}, \ldots, z_{N(i+1)})$ in the (i+1)-th iteration. This iteration continues until convergence (i.e. $CF(z_1, z_2, \ldots, z_N)$ does not reduce any further) or a preset number of iterations is reached.

Specifically, in the i-th iteration, in the vicinity of $(z_{1i}, z_{2i}, \ldots, z_{Ni})$ $$f_p(z_1, z_2, \ldots, z_N) \approx f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \quad \text{(Eq. 3)}$$

Under the approximation of Eq. 3, the cost function becomes:

$$CF(z_1, z_2, \ldots, z_N) = \sum_{p=1}^{P} w_p f_p^2(z_1, z_2, \ldots, z_N) = \sum_{p=1}^{P} w_p \left( f_p(z_{1i}, z_{2i}, \ldots, z_{Ni}) + \sum_{n=1}^{N} \frac{\partial f_p(z_1, z_2, \ldots, z_N)}{\partial z_n}\bigg|_{z_1=z_{1i}, z_2=z_{2i}, \ldots, z_N=z_{Ni}} (z_n - z_{ni}) \right)^2 \quad \text{(Eq. 4)}$$

which is a quadratic function of the design variables $(z_1, z_2, \ldots, z_N)$. Every term is constant except the design variables $(z_1, z_2, \ldots, z_N)$.

If the design variables $(z_1, z_2, \ldots, z_N)$ are not under any constraints, $z_{1(i+1)}, z_{2(i+1)}, \ldots, z_{N(i+1)})$ can be derived by solving by N linear equations:

$$\frac{\partial CF(z_1, z_2, \ldots, z_N)}{\partial z_n} = 0),$$

wherein n=1, 2, . . . N.

If the design variables $(z_1, z_2, \ldots, z_N)$ are under the constraints in the form of J inequalities (e.g. tuning ranges of $(z_1, z_2, \ldots, z_N)$)

$$\sum_{n=1}^{N} A_{nj} z_n \le B_j,$$

for j=1, 2, . . . J; and K equalities (e.g. interdependence between the design variables)

$$\sum_{n=1}^{N} C_{nk} z_n \le D_k,$$

for k=1, 2, . . . K; the optimization process becomes a classic quadratic programming problem, wherein $A_{nj}$, $B_j$, $C_{nk}$, $D_k$ are constants. Additional constraints can be imposed for each iteration. For example, a "damping factor" $\Delta_D$ can be introduced to limit the difference between $(z_{1(i+1)}, z_{2(i+1)}, \ldots, z_{N(i+1)})$ and $(z_{1i}, z_{2i}, \ldots, z_{Ni})$, so that the approximation of Eq. 3 holds. Such constraints can be expressed as $z_{ni}-\Delta_D \le z_n \le z_{ni}+\Delta_D$. $(z_{1(i+1)}, z_{2(i+1)}, \ldots, z_{N(i+1)})$ can be derived using, for example, methods described in Numerical Optimization (2nd ed.) by Jorge Nocedal and Stephen J. Wright (Berlin New York: Vandenberghe. Cambridge University Press).

Instead of minimizing the RMS of $f_p(z_1, z_2, \ldots, z_N)$, the optimization process can minimize magnitude of the largest deviation (the worst defect) among the evaluation points to their intended values. In this approach, the cost function can alternatively be expressed as $$CF(z_1, z_2, \ldots, z_N) = \max_{1 \le p \le P} \frac{f_p(z_1, z_2, \ldots, z_N)}{CL_p} \quad \text{(Eq. 5)}$$

wherein $CL_p$ is the maximum allowed value for $f_p(z_1, z_2, \ldots, z_N)$. This cost function represents the worst defect among the evaluation points. Optimization using this cost function minimizes magnitude of the worst defect. An iterative greedy algorithm can be used for this optimization.

The cost function of Eq. 5 can be approximated as:

$$CF(z_1, z_2, \ldots, z_N) = \sum_{p=1}^{P} \left( \frac{f_p(z_1, z_2, \ldots, z_N)}{CL_p} \right)^q \quad \text{(Eq. 6)}$$

wherein q is an even positive integer such as at least 4, preferably at least 10. Eq. 6 mimics the behavior of Eq. 5, while allowing the optimization to be executed analytically and accelerated by using methods such as the deepest descent method, the conjugate gradient method, etc. Minimizing the worst defect size can also be combined with linearizing of $f_p(z_1, z_2, \ldots, z_N)$. Specifically, $f_p(z_1, z_2, \ldots, z_N)$ is approximated as in Eq. 3. Then the constraints on worst defect size are written as inequalities $E_{Lp} \le f_p(z_1, z_2, \ldots, z_N) \le E_{Up}$, wherein $E_{Lp}$ and $E_{Up}$ are two constants specifying the minimum and maximum allowed deviation for the $f_p(z_1, z_2, \ldots, z_N)$. Plugging Eq. 3 in, these constraints are transformed to, for p=1, . . . P, $$\sum_{n=1}^{N} \frac{\partial f_p(z_1, z_2, \ldots, z_N)}{\partial z_n}\Bigg|_{z_1=z_{1i}, z_2=z_{2i}, \ldots, z_N=z_{Ni}} z_n \le E_{Up} \sum_{n=1}^{N} \frac{\partial f_p(z_1, z_2, \ldots, z_N)}{\partial z_n}\Bigg|_{z_1=z_{1i}, z_2=z_{2i}, \ldots, z_N=z_{Ni}} z_{ni} - f_p(z_{1i}, z_{2i}, \ldots, z_{Ni}) \quad \text{(Eq. 6')}$$

and $$-\sum_{n=1}^{N} \frac{\partial f_p(z_1, z_2, \ldots, z_N)}{\partial z_n}\Bigg|_{z_1=z_{1i}, z_2=z_{2i}, \ldots, z_N=z_{Ni}} z_n \le -E_{Up} - \sum_{n=1}^{N} \frac{\partial f_p(z_1, z_2, \ldots, z_N)}{\partial z_n}\Bigg|_{z_1=z_{1i}, z_2=z_{2i}, \ldots, z_N=z_{Ni}} z_{ni} + f_p(z_{1i}, z_{2i}, \ldots, z_{Ni}) \quad \text{(Eq. 6'')}$$

Since Eq. 3 is generally valid only in the vicinity of ($z_{1i}$, $z_{2i}$, . . . , $z_{Ni}$), in case the desired constraints $E_{Lp} \le f_p(z_1, z_2, \ldots, z_N) \le E_{Up}$ cannot be achieved in such vicinity, which can be determined by any conflict among the inequalities, the constants $E_{Lp}$ and $E_{Up}$ can be relaxed until the constraints are achievable. This optimization process minimizes the worst defect size in the vicinity of ($z_{1i}$, $z_{2i}$, . . . , $z_{Ni}$). Then each step reduces the worst defect size gradually, and each step is executed iteratively until certain terminating conditions are met. This will lead to optimal reduction of the worst defect size.

Another way to minimize the worst defect is to adjust the weight $w_p$ in each iteration. For example, after the i-th iteration, if the r-th evaluation point is the worst defect, $w_r$ can be increased in the (i+1)-th iteration so that the reduction of that evaluation point's defect size is given higher priority. In addition, the cost functions in Eq.4 and Eq.5 can be modified by introducing a Lagrange multiplier to achieve compromise between the optimization on RMS of the defect size and the optimization on the worst defect size, i.e., $$CF(z_1, z_2, \ldots, z_N) = (1-\lambda)\sum_{p=1}^{P} w_p f_p^2(z_1, z_2, \ldots, z_N) + \lambda_1 \max_{1\le p\le P} \frac{f_p(z_1, z_2, \ldots, z_N)}{CL_p} \quad \text{(Eq. 6'')}$$

where $\lambda$ is a preset constant that specifies the trade-off between the optimization on RMS of the defect size and the optimization on the worst defect size. In particular, if $\lambda=0$, then this becomes Eq.4 and the RMS of the defect size is only minimized; while if $\lambda=1$, then this becomes Eq.5 and the worst defect size is only minimized; if $0<\lambda<1$, then both are taken into consideration in the optimization. Such optimization can be solved using multiple methods. For example, the weighting in each iteration may be adjusted, similar to the one described previously. Alternatively, similar to minimizing the worst defect size from inequalities, the inequalities of Eq. 6' and 6" can be viewed as constraints of the design variables during solution of the quadratic programming problem. Then, the bounds on the worst defect size can be relaxed incrementally or increase the weight for the worst defect size incrementally, compute the cost function value for every achievable worst defect size, and choose the design variable values that minimize the total cost function as the initial point for the next step. By doing this iteratively, the minimization of this new cost function can be achieved.

Optimizing a lithographic projection apparatus can expand the process window. A larger process window provides more flexibility in process design and chip design. The process window can be defined as a set of focus and dose values for which the resist image are within a certain limit of the design target of the resist image. Note that all the methods discussed here may also be extended to a generalized process window definition that can be established by different or additional base parameters in addition to exposure dose and defocus. These may include, but are not limited to, optical settings such as NA, sigma, aberrations, polarization, or optical constants of the resist layer. For example, as described earlier, if the PW also consists of different mask bias, then the optimization includes the minimization of MEEF (Mask Error Enhancement Factor), which is defined as the ratio between the substrate EPE and the induced mask edge bias. The process window defined on focus and dose values only serve as an example in this disclosure. A method of maximizing the process window, according to an embodiment, is described below.

In a first step, starting from a known condition ($f_0$, $\varepsilon_0$) in the process window, wherein $f_0$ is a nominal focus and $\varepsilon_0$ is a nominal dose, minimizing one of the cost functions below in the vicinity $$(f_0 \pm \Delta_f, \varepsilon_0 \pm \Delta\varepsilon):\ CF(z_1, z_2, \ldots, z_N, f_0, \varepsilon_0) = \max_{(f,\varepsilon)=(f_0\pm\Delta_f, \varepsilon_0\pm\Delta\varepsilon)} \max_p |f_p(z_1, z_2, \ldots, z_N, f, \varepsilon)| \quad \text{(Eq. 7)}$$

or $$CF(z_1, z_2, \ldots, z_N, f_0, \varepsilon_0) = \sum_{(f,\varepsilon)=(f_0\pm\Delta_f, \varepsilon_0\pm\Delta\varepsilon)} \sum_p w_p f_p^2(z_1, z_2, \ldots, z_N, f, \varepsilon) \quad \text{(Eq. 7')}$$

or $$CF(z_1, z_2, \ldots, z_N, f_0, \varepsilon_0) = (1-\lambda) \sum_{(f,\varepsilon)=(f_0\pm\Delta_f, \varepsilon_0\pm\Delta\varepsilon)} \sum_p w_p f_p^2(z_1, z_2, \ldots, z_N, f, \varepsilon) + \lambda \max_{(f,\varepsilon)=(f_0\pm\Delta_f, \varepsilon_0\pm\Delta\varepsilon)} \max_p |f_p(z_1, z_2, \ldots, z_N, f, \varepsilon)| \quad \text{(Eq. 7'')}$$

If the nominal focus $f_0$ and nominal dose $\varepsilon_0$ are allowed to shift, they can be optimized jointly with the design variables ($z_1$, $z_2$, . . . , $z_N$). In the next step, ($f_0 \pm \Delta_f$, $\varepsilon_0 \pm \Delta\varepsilon$) is accepted as part of the process window, if a set of values of ($z_1$, $z_2$, . . . , $z_N$, $f$, $\varepsilon$) can be found such that the cost function is within a preset limit.

Alternatively, if the focus and dose are not allowed to shift, the design variables ($z_1$, $z_2$, . . . , $z_N$) are optimized with the focus and dose fixed at the nominal focus $f_0$ and nominal dose $\varepsilon_0$. In an alternative embodiment, ($f_0 \pm \Delta f$, $\varepsilon_0 \pm \Delta\varepsilon$) is accepted as part of the process window, if a set of values of ($z_1$, $z_2$, . . . , $z_N$) can be found such that the cost function is within a preset limit.

The methods described earlier in this disclosure can be used to minimize the respective cost functions of Eqs. 7, 7', or 7". If the design variables are characteristics of the projection optics, such as the Zernike coefficients, then minimizing the cost functions of Eqs. 7, 7', or 7" leads to process window maximization based on projection optics optimization, i.e., LO. If the design variables are characteristics of the source and patterning device in addition to those of the projection optics, then minimizing the cost function of Eqs. 7, 7', or 7" leads to process window maximizing based on SMLO, as illustrated in FIG. 8. If the design variables are characteristics of the source and patterning device and, then minimizing the cost functions of Eqs. 7, 7', or 7" leads to process window maximization based on SMO. The cost functions of Eqs. 7, 7', or 7" can also include at least one $f_p(z_1, z_2, \ldots, z_N)$ such as that in Eq. 7 or Eq. 8, that is a function of one or more stochastic effects such as the LWR or local CD variation of 2D features, and throughput.

Figure 10:
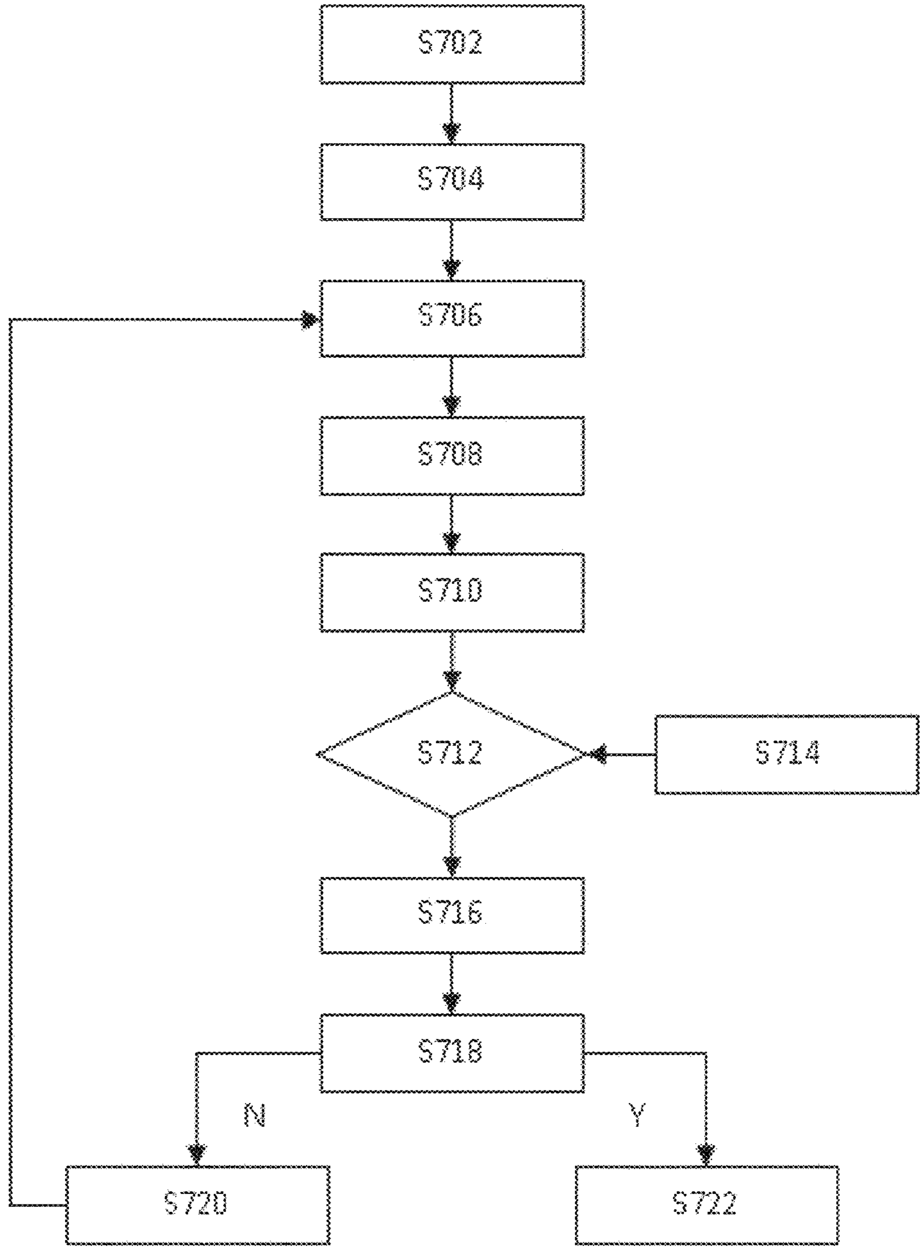

FIG. 10 shows one specific example of how a simultaneous SMLO process can use a Gauss Newton Algorithm for optimization. In step S702, starting values of design variables are identified. Tuning ranges for each variable may also be identified. In step S704, the cost function is defined using the design variables. In step S706 cost function is expanded around the starting values for all evaluation points in the design layout. In optional step S710, a full-chip simulation is executed to cover all critical patterns in a full-chip design layout. Desired lithographic response metric (such as CD or EPE) is obtained in step S714, and compared with predicted values of those quantities in step S712. In step S716, a process window is determined. Steps S718, S720, and S722 are similar to corresponding steps S514, S516 and S518, as described with respect to FIG. 9A. As mentioned before, the final output may be a wavefront aberration map in the pupil plane, optimized to produce the desired imaging performance. The final output may also be an optimized source map or an optimized design layout.

Figure 9B:
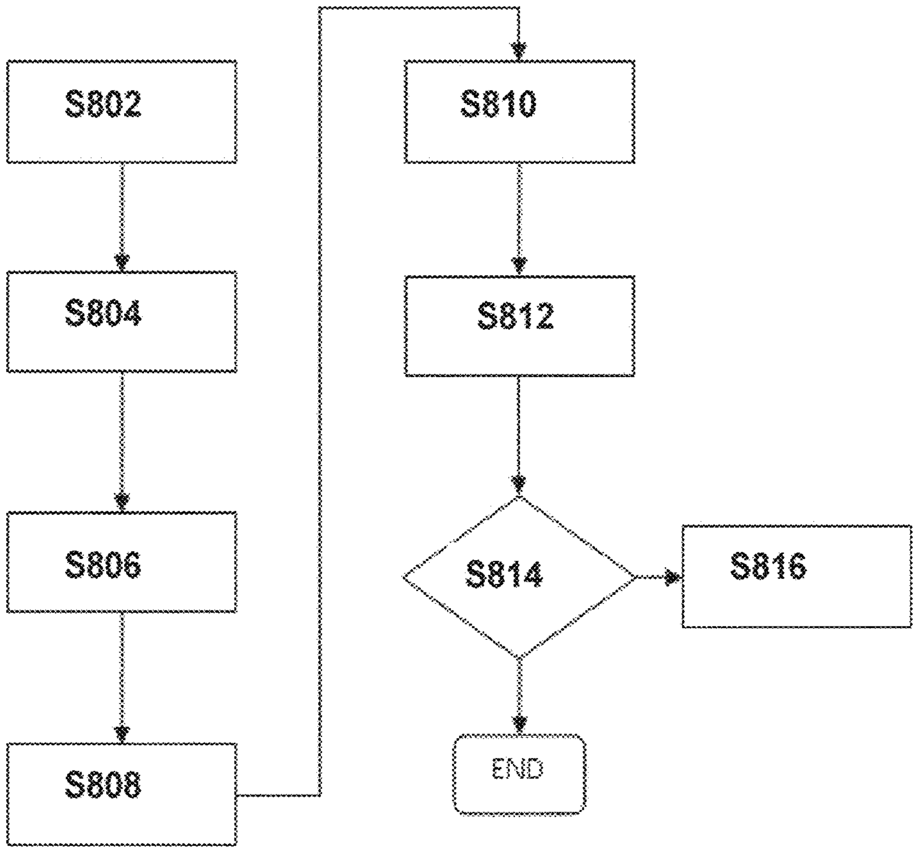

FIG. 9B shows an exemplary method to optimize the cost function where the design variables $(z_1, z_2, \ldots, z_N)$ include design variables that may only assume discrete values.

The method starts by defining the pixel groups of the illumination source and the patterning device tiles of the patterning device (step S802). Generally, a pixel group or a patterning device tile may also be referred to as a division of a lithographic process component. In one exemplary approach, the illumination source is divided into 117 pixel groups, and 94 patterning device tiles are defined for the patterning device, substantially as described above, resulting in a total of 211 divisions.

In step S804, a lithographic model is selected as the basis for photolithographic simulation. Photolithographic simulations produce results that are used in calculations of photolithographic metrics, or responses. A particular photolithographic metric is defined to be the performance metric that is to be optimized (step S806). In step S808, the initial (pre-optimization) conditions for the illumination source and the patterning device are set up. Initial conditions include initial states for the pixel groups of the illumination source and the patterning device tiles of the patterning device such that references may be made to an initial illumination shape and an initial patterning device pattern. Initial conditions may also include mask bias, NA, and focus ramp range. Although steps S802, S804, S806, and S808 are depicted as sequential steps, it will be appreciated that in other embodiments of the invention, these steps may be performed in other sequences.

In step S810, the pixel groups and patterning device tiles are ranked. Pixel groups and patterning device tiles may be interleaved in the ranking. Various ways of ranking may be employed, including: sequentially (e.g., from pixel group 1 to pixel group 117 and from patterning device tile 1 to patterning device tile 94), randomly, according to the physical locations of the pixel groups and patterning device tiles (e.g., ranking pixel groups closer to the center of the illumination source higher), and according to how an alteration of the pixel group or patterning device tile affects the performance metric.

Once the pixel groups and patterning device tiles are ranked, the illumination source and patterning device are adjusted to improve the performance metric (step S812). In step S812, each of the pixel groups and patterning device tiles are analyzed, in order of ranking, to determine whether an alteration of the pixel group or patterning device tile will result in an improved performance metric. If it is determined that the performance metric will be improved, then the pixel group or patterning device tile is accordingly altered, and the resulting improved performance metric and modified illumination shape or modified patterning device pattern form the baseline for comparison for subsequent analyses of lower-ranked pixel groups and patterning device tiles. In other words, alterations that improve the performance metric are retained. As alterations to the states of pixel groups and patterning device tiles are made and retained, the initial illumination shape and initial patterning device pattern changes accordingly, so that a modified illumination shape and a modified patterning device pattern result from the optimization process in step S812.

In other approaches, patterning device polygon shape adjustments and pairwise polling of pixel groups or patterning device tiles are also performed within the optimization process of S812.

In an alternative embodiment the interleaved simultaneous optimization procedure may include to alter a pixel group of the illumination source and if an improvement of the performance metric is found, the dose is stepped up and down to look for further improvement. In a further alternative embodiment the stepping up and down of the dose or intensity may be replaced by a bias change of the patterning device pattern to look for further improvement in the simultaneous optimization procedure.

In step S814, a determination is made as to whether the performance metric has converged. The performance metric may be considered to have converged, for example, if little or no improvement to the performance metric has been witnessed in the last several iterations of steps S810 and S812. If the performance metric has not converged, then the steps of S810 and S812 are repeated in the next iteration, where the modified illumination shape and modified patterning device from the current iteration are used as the initial illumination shape and initial patterning device for the next iteration (step S816).

The optimization methods described above may be used to increase the throughput of the lithographic projection apparatus. For example, the cost function may include an $f_p(z_1, z_2, \ldots, z_N)$ that is a function of the exposure time. Optimization of such a cost function is preferably constrained or influenced by a measure of the stochastic effects or other metrics. Specifically, a computer-implemented method for increasing a throughput of a lithographic process may include optimizing a cost function that is a function of one or more stochastic effects of the lithographic process and a function of an exposure time of the substrate, in order to minimize the exposure time.

In one embodiment, the cost function includes at least one $f_p(z_1, z_2, \ldots, z_N)$ that is a function of one or more stochastic effects. The stochastic effects may include the failure of a feature, measurement data (e.g., SEPE) determined as in method of FIG. 3, LWR or local CD variation of 2D features.

In one embodiment, the stochastic effects include stochastic variations of characteristics of a resist image. For example, such stochastic variations may include failure rate of a feature, line edge roughness (LER), line width roughness (LWR) and critical dimension uniformity (CDU). Including stochastic variations in the cost function allows finding values of design variables that minimize the stochastic variations, thereby reducing risk of defects due to stochastic effects.

Figure 11:
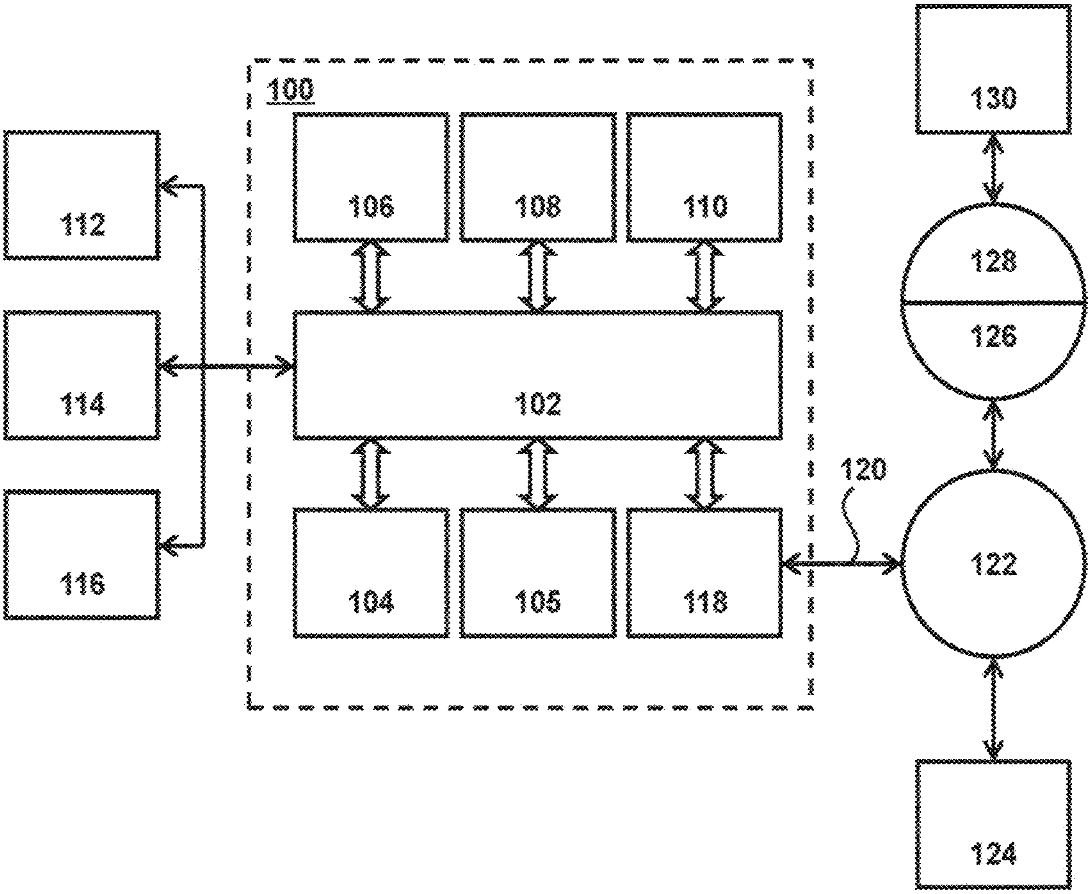
FIG. 11 is a block diagram of an example computer system, according to an embodiment.

FIG. 11 is a block diagram that illustrates a computer system 100 which can assist in implementing in various methods and systems disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term “computer-readable medium” as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the “Internet” 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide for the illumination optimization of the embodiment, for example.

The received code may be executed by processor 104 as it is received, or stored in storage device 110, or other non-volatile storage for later execution. In this manner, computer system 100 may obtain application code in the form of a carrier wave.

Embodiments of the present disclosure can be further described by the following clauses.

1. A computer-implemented method for determining values of design variables of a lithographic process based on a predicted failure rate for printing a target pattern on a substrate using a lithographic apparatus, the method comprising:
   obtaining an image corresponding to a target pattern to be printed on a substrate using a lithographic apparatus, wherein the image is generated based on a set of values of design variables of the lithographic apparatus or a lithographic process;
   determining image properties, the image properties representative of a pattern printed on the substrate, the pattern corresponding to the target pattern;
   predicting a failure rate in printing the pattern on the substrate based on the image properties; and
   determining a specified value of a specified design variable based on the failure rate, the specified value to be used in the lithographic process to print the target pattern on the substrate.
2. The method of clause 1, wherein determining the specified value includes determining a value of the specified design variable for which a predicted failure rate satisfies a failure rate condition.
3. The method of clause 2, wherein determining the specified value further includes:
   determining the value for which a throughput value satisfies a throughput condition.
4. The method of clause 2, wherein determining the specified value further includes:
   determining the value for which a local critical dimension uniformity value satisfies a local critical dimension uniformity condition.
5. The method of clause 2, wherein determining the specified value of the specified design variable includes:
   determining a mask bias value for which the predicted failure rate satisfies the failure rate condition.
6. The method of clause 5, wherein determining the mask bias value further includes:
   determining the mask bias value for which a throughput value satisfies a throughput condition.
7. The method of clause 5, wherein determining the mask bias value further includes:
   determining the mask bias value for which a local critical dimension uniformity value satisfies a local critical dimension uniformity condition.
8. The method of clause 2, wherein determining the specified value of the specified design variable includes:
   determining a pupil shape for which the predicted failure rate satisfies the failure rate condition.
9. The method of clause 8, wherein determining the pupil shape further includes:
   determining the pupil shape for which a throughput value satisfies a throughput condition.
10. The method of clause 2, wherein determining the specified value of the specified design variable includes:
   determining a target critical dimension value for which the predicted failure rate satisfies the failure rate condition.
11. The method of clause 10, wherein determining the target critical dimension value further includes:
   determining the target critical dimension value for which a local critical dimension uniformity value satisfies a local critical dimension uniformity condition.
12. The method of clause 1, wherein determining the specified value includes:
   determining at least one of mask bias value, a pupil shape, a target critical dimension value, a dose value, or a focus value based on the failure rate.
13. The method of clause 1, wherein predicting the failure rate includes:
   obtaining (a) a set of images of a specified pattern to be printed on a specified substrate, wherein each image of the set of images is generated based on different sets of values of the design variables, and (b) measured failure rates, wherein each failure rate corresponds to a set of values of the different sets of values of the design variables; and
   correlating the measured failure rates with image properties of the set of images to predict the failure rate.
14. The method of clause 1, wherein the image corresponding to the target pattern is one of an aerial image, a resist image, an etch image, or a mask image.
15. The method of clause 14, wherein determining the image properties include extracting, by a lithographic model, at least one of (a) a product of peak intensity and dose, (b) a product of intensity integral and dose, or (c) image log slope from the aerial image.
16. The method of clause 1, wherein obtaining the image includes:
   providing a first set of values of the design variables as input to a lithographic model, wherein the lithographic model is configured to generate aerial images of patterns to be printed on the substrate; and
   generating, by the lithographic model, a first aerial image based on the first set of values.
17. The method of clause 16, wherein the lithographic model is configured to generate the aerial image by:
   obtaining mean critical dimension measurements of a specified pattern for different sets of values of the design variables; and
   training, the lithographic model, to generate a specified aerial image of the specified pattern for each set of values of the different sets of values of the design variables.
18. The method of clause 1, wherein determining the specified value of the specified design variable includes:
   determining at least one of a source variable of an illumination source or a mask variable of a mask pattern in a source mask optimization process based on the failure rate.
19. The method of clause 18, wherein determining the at least one of the source variable or the mask variable includes:
   computing a cost function to determine the at least one of the source variable or the mask variable based on the failure rate; and
   determining the at least one of the source variable or the mask variable by minimizing the cost function.
20. The method of clause 19, wherein computing the cost function includes:

computing a gradient of the cost function for the at least one of the source variable or the mask variable; and determining the at least one of the source variable or the mask variable by minimizing the gradient of the cost function.

21. The method of clause 19, wherein computing the cost function includes:

computing a gradient of the failure rate for an aerial image associated with the target pattern; and determining the at least one of the source variable or the mask variable by minimizing the gradient of the failure rate.

22. The method of clause 1, wherein the design variables include a critical dimension of the target pattern printed on the substrate, a mask bias, or a mask type.

23. The method of clause 1, wherein the design variables include a pupil of an illumination source of the lithographic apparatus, a dose of the illumination source, or a focus associated with radiation from the illumination source.

24. The method of clause 1, wherein determining the specified value includes:

determining at least one of mask bias value, a pupil shape, a target critical dimension value, a dose value, or a focus value for which a lithographic metric satisfies a specified condition and a throughput value satisfies a throughput condition.

25. The method of clause 24, wherein the lithographic metric includes one or more of a depth of focus, an exposure latitude, a local critical dimension uniformity, or the failure rate.

26. The method of clause 1 further comprising:

performing a patterning process with the specified value of the specified design variable to print a pattern corresponding to the target pattern on the substrate.

27. A computer-implemented method for determining values of design variables of a lithographic process based on a predicted failure rate for printing a target pattern on a substrate using a lithographic apparatus, the method comprising:

obtaining an image corresponding to a target pattern to be printed on a substrate using a lithographic apparatus, wherein the image is generated based on a set of values of design variables of the lithographic apparatus or a lithographic process;

determining image properties, the image properties representative of a pattern printed on the substrate, the pattern corresponding to the target pattern;

predicting a failure rate in printing the pattern on the substrate based on the image properties; and determining a specified value of a specified design variable based on the failure rate and a throughput value, the specified value to be used in the lithographic process to print the target pattern on the substrate.

28. The method of clause 27, wherein determining the specified value includes determining a value of the specified design variable for which a predicted failure rate satisfies a failure rate condition and the throughput value satisfies a throughput condition.

29. The method of clause 27, wherein determining the specified value includes:

determining at least one of mask bias value, a pupil shape, a target critical dimension value, a dose value, or a focus value for which a lithographic metric satisfies a specified condition and the throughput value satisfies a throughput condition.

30. The method of clause 29, wherein the lithographic metric includes one or more of a depth of focus, an exposure latitude, a local critical dimension uniformity, or the failure rate.

31. The method of clause 27, wherein predicting the failure rate includes:

obtaining (a) a set of images of a specified pattern to be printed on a specified substrate, wherein each image of the set of images is generated based on different sets of values of the design variables, and (b) measured failure rates, wherein each failure rate corresponds to a set of values of the different sets of values of the design variables; and correlating the measured failure rates with image properties of the set of images to predict the failure rate.

32. The method of clause 27, wherein the image corresponding to the target pattern is one of an aerial image, a resist image, an etch image, or a mask image.

33. The method of clause 32, wherein determining the image properties include extracting, by a lithographic model, at least one of (a) a product of peak intensity and dose, (b) a product of intensity integral and dose, or (c) image log slope from the aerial image.

34. The method of clause 27, wherein determining the specified value of the specified design variable includes:

determining at least one of a source variable of an illumination source or a mask variable of a mask pattern in a source mask optimization process based on the failure rate.

35. The method of clause 34, wherein determining the at least one of the source variable or the mask variable includes:

computing a cost function to determine the at least one of the source variable or the mask variable based on the failure rate; and determining the at least one of the source variable or the mask variable by minimizing the cost function.

36. The method of clause 35, wherein computing the cost function includes:

computing a gradient of the cost function for the at least one of the source variable or the mask variable; and determining the at least one of the source variable or the mask variable by minimizing the gradient of the cost function.

37. The method of clause 35, wherein computing the cost function includes:

computing a gradient of the failure rate for an aerial image associated with the target pattern; and determining the at least one of the source variable or the mask variable by minimizing the gradient of the failure rate.

38. The method of clause 27, wherein the design variables include a critical dimension of the target pattern printed on the substrate, a mask bias, or a mask type.

39. The method of clause 27, wherein the design variables include a pupil of an illumination source of the lithographic apparatus, a dose of the illumination source, or a focus associated with radiation from the illumination source.

40. The method of clause 27 further comprising:

performing a patterning process with the specified value of the specified design variable to print a pattern corresponding to the target pattern on the substrate.

41. A non-transitory computer readable medium having instructions recorded thereon, the instructions when executed by a computer implementing the method of any of the above clauses.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

As used herein, unless specifically stated otherwise, the term "or" encompasses all possible combinations, except where infeasible. For example, if it is stated that a component includes A or B, then, unless specifically stated otherwise or infeasible, the component may include A, or B, or A and B. As a second example, if it is stated that a component includes A, B, or C, then, unless specifically stated otherwise or infeasible, the component may include A, or B, or C, or A and B, or A and C, or B and C, or A and B and C. Expressions such as "at least one of" do not necessarily modify an entirety of a following list and do not necessarily modify each member of the list, such that "at least one of A, B, and C" should be understood as including only one of A, only one of B, only one of C, or any combination of A, B, and C. The phrase "one of A and B" or "any one of A and B" shall be interpreted in the broadest sense to include one of A, or one of B.

The descriptions above are intended to be illustrative, not limiting. Thus, it will be apparent to one skilled in the art that modifications may be made as described without departing from the scope of the claims set out below.

The invention claimed is:

1. A method for determining a value of a design variable of a lithographic process based on a predicted failure rate for printing a target pattern on a substrate using a lithographic apparatus, the method comprising:

obtaining an image corresponding to a target pattern to be printed on a substrate using a lithographic apparatus, wherein the image is generated based on a set of values of design variables of the lithographic apparatus or of a lithographic process;

determining image properties, the image properties representative of a pattern printed on the substrate, the pattern corresponding to the target pattern;

predicting, by a hardware computer system using a failure rate model, a failure rate in printing the pattern on the substrate based on the image properties; and determining, using a separate model from the failure rate model, a specified value of a specified design variable based on the failure rate, the specified value to be used in the lithographic process to print the target pattern on the substrate.

2. The method of claim 1, wherein determining the specified value includes determining a value of the specified design variable for which a predicted failure rate satisfies a failure rate condition.

3. The method of claim 1, wherein predicting the failure rate includes:

obtaining (a) a set of images of a specified pattern to be printed on a specified substrate, wherein each image of the set of images is generated based on different sets of values of the design variables, and (b) measured failure rates, wherein each failure rate corresponds to a set of values of the different sets of values of the design variables; and correlating the measured failure rates with image properties of the set of images to predict the failure rate, wherein the image corresponding to the target pattern is an aerial image, a resist image, an etch image, or a mask image.

4. The method of claim 1, wherein determining the image properties include extracting, by a lithographic model, at least one selected from: (a) a product of peak intensity and dose, (b) a product of intensity integral and dose, and/or (c) image log slope from the image.

5. The method of claim 1, wherein obtaining the image includes:

providing a first set of values of the design variables as input to a lithographic model, wherein the lithographic model is configured to generate aerial images of patterns to be printed on the substrate; and generating, by the lithographic model, an aerial image based on the first set of values.

6. A non-transitory computer readable medium having instructions therein, the instructions, when executed by a computer system, configured to cause the computer system to at least:

obtain an image corresponding to a target pattern to be printed on a substrate using a lithographic apparatus, wherein the image is generated based on a set of values of design variables of the lithographic apparatus or of a lithographic process;

determine image properties, the image properties representative of a pattern printed on the substrate, the pattern corresponding to the target pattern;

predict, using a failure rate model, a failure rate in printing the pattern on the substrate based on the image properties; and determine, using a separate model from the failure rate model, a specified value of a specified design variable based on the failure rate, the specified value to be used in the lithographic process to print the target pattern on the substrate.

7. The medium of claim 6, wherein the instructions configured to cause the computer system to determine a specified value are further configured to cause the computer system to determine a value of the specified design variable for which a predicted failure rate satisfies a failure rate condition.

8. The medium of claim 7, wherein the instructions configured to cause the computer system to determine a specified value are further configured to cause the computer system to determine the value for which a throughput value satisfies a throughput condition.

9. The medium of claim 7, wherein the instructions configured to cause the computer system to determine a specified value are further configured to cause the computer system to determine, based on the failure rate, at least one selected from: a mask bias value, a pupil shape, a target critical dimension value, a dose value, and/or a focus value.

10. The medium of claim 6, wherein the instructions configured to cause the computer system to predict the failure rate are further configured to cause the computer system to:

obtain (a) a set of images of a specified pattern to be printed on a specified substrate, wherein each image of the set of images is generated based on different sets of values of the design variables, and (b) measured failure rates, wherein each failure rate corresponds to a set of values of the different sets of values of the design variables; and correlate the measured failure rates with image properties of the set of images to predict the failure rate, wherein the image corresponding to the target pattern is an aerial image, a resist image, an etch image, or a mask image.

11. The medium of claim 6, wherein the instructions configured to cause the computer system to determine the image properties are further configured to cause the computer system to extract, by a lithographic model, at least one selected from: (a) a product of peak intensity and dose, (b) a product of intensity integral and dose, and/or (c) image log slope from the aerial image.

12. The medium of claim 6, wherein the instructions configured to cause the computer system to obtain the image are further configured to cause the computer system to:

provide a first set of values of the design variables as input to a lithographic model, wherein the lithographic model is configured to generate aerial images of patterns to be printed on the substrate; and generate, by the lithographic model, an aerial image based on the first set of values.

13. The medium of claim 12, wherein the lithographic model is configured to generate the aerial image by:

obtaining of mean critical dimension measurements of a specified pattern for different sets of values of the design variables; and training of the lithographic model to generate a specified aerial image of the specified pattern for each set of values of the different sets of values of the design variables.

14. The medium of claim 6, wherein the instructions configured to cause the computer system to determine a specified value are further configured to cause the computer system to determine, based on the failure rate, an illumination variable of an illumination and/or a mask variable of a mask pattern in an illumination-mask optimization process.

15. The medium of claim 14, wherein the instructions configured to cause the computer system to determine the illumination variable and/or the mask variable are further configured to cause the computer system to:

compute a cost function to determine, based on the failure rate, the illumination variable and/or the mask variable; and determine the illumination variable and/or the mask variable by minimization of the cost function.

16. The medium of claim 15, wherein the instructions configured to cause the computer system to compute the cost function are further configured to cause the computer system to:

compute a gradient of the cost function for the illumination variable and/or the mask variable; and determine the illumination variable and/or the mask variable by minimization of the gradient of the cost function.

17. The medium of claim 15, wherein the instructions configured to cause the computer system to compute the cost function are further configured to cause the computer system to:

compute a gradient of the failure rate for an aerial image associated with the target pattern; and determine the illumination variable and/or the mask variable by minimization of the gradient of the failure rate.

18. The medium of claim 6, wherein the design variables include a critical dimension of the target pattern printed on the substrate, a mask bias, or a mask type.

19. The medium of claim 6, wherein the design variables include a pupil of an illumination within the lithographic apparatus, a dose of the illumination, or a focus associated with radiation from the illumination.

20. The medium of claim 6, wherein the instructions configured to cause the computer system to determine a specified value are further configured to cause the computer system to determine at least one selected from: a mask bias value, a pupil shape, a target critical dimension value, a dose value, and/or a focus value, for which a lithographic metric satisfies a specified condition and a throughput value satisfies a throughput condition, wherein the lithographic metric includes one or more selected from: a depth of focus, an exposure latitude, a local critical dimension uniformity, and/or the failure rate.

* * * * *